US012794422B2

(12) United States Patent
Aldhaher

(10) Patent No.: US 12,794,422 B2
(45) Date of Patent: Nov. 10, 2026

(54) HIGH FREQUENCY WIRELESS POWER TRANSFER SYSTEM, TRANSMITTER AND RECEIVER THEREFOR

(71) Applicant: Solace Power Inc., Mount Pearl (CA)

(72) Inventor: Samer Aldhaher, Mount Pearl (CA)

(73) Assignee: SOLACE POWER INC., Mount Pearl (CA)

( * ) Notice: Subject to any disclaimer, the term of this patent is extended or adjusted under 35 U.S.C. 154(b) by 474 days.

(21) Appl. No.: 18/467,147

(22) Filed: Sep. 14, 2023

(65) Prior Publication Data

US 2024/0007062 A1 Jan. 4, 2024

Related U.S. Application Data

(63) Continuation of application No. 17/018,328, filed on Sep. 11, 2020, now Pat. No. 11,817,834.
(Continued)

(51) Int. Cl.
*H03F 3/21* (2006.01)
*H02M 3/00* (2006.01)
(Continued)

(52) U.S. Cl.
CPC ............ *H03F 3/2176* (2013.01); *H02M 3/01* (2021.05); *H02M 3/33569* (2013.01);
(Continued)

(58) Field of Classification Search
CPC .... H03F 3/2176; H03F 3/19; H03F 2200/451; H03F 3/193; H03F 3/217; H03F 3/2173;
(Continued)

(56) References Cited

U.S. PATENT DOCUMENTS 5,479,337 A 12/1995 Voigt
6,724,255 B2 * 4/2004 Kee ......................... H03F 3/217
330/251
(Continued)

FOREIGN PATENT DOCUMENTS

CN 104756391 A 7/2015
CN 106505901 A 3/2017
(Continued)

OTHER PUBLICATIONS

Zulinski, R. E. and Grady, K. J. "Load-independent Class E Power Inverters: Part I. Theoretical Development" *IEEE Trans.*, Circuits Syst. I, Reg. Papers, (Aug. 1990). vol. 37, No. 8, pp. 1010-1018.
(Continued)

*Primary Examiner* — Khanh V Nguyen
(74) *Attorney, Agent, or Firm* — Harness, Dickey & Pierce, P.L.C.

(57) ABSTRACT

A load independent inverter comprises a switched mode zero-voltage switching (ZVS) amplifier. The switched mode ZVS amplifier comprising: a pair of circuits comprises: at least a transistor and at least a capacitor arranged in parallel; and at least an inductor arranged in series with the transistor and capacitor. The amplifier further comprises only one ZVS inductor connected to the pair of circuits; and at least a pair of capacitors connected to the ZVS inductor and arranged in series with at least an inductor and at least a resistor.

19 Claims, 15 Drawing Sheets

Related U.S. Application Data

(60) Provisional application No. 62/899,165, filed on Sep. 12, 2019.

(51) Int. Cl.
*H02M 3/335* (2006.01)
*H03F 3/19* (2006.01)
*H03F 3/217* (2006.01)
*H02M 1/00* (2006.01)

(52) U.S. Cl.
CPC .......... *H02M 3/33592* (2013.01); *H03F 3/19* (2013.01); *H02M 1/0058* (2021.05); *H02M 1/007* (2021.05)

(58) Field of Classification Search
CPC ............. H03F 3/2171; H03F 2200/432; H03F 2200/351; H02M 3/01; H02M 3/33569; H02M 3/33592; H02M 1/0058; H02M 1/007; H02M 7/4815; H02M 7/537; H02J 50/10; H02J 50/20; Y02B 70/10
USPC .............................................. 330/251, 207 A
See application file for complete search history.

(56) References Cited

U.S. PATENT DOCUMENTS

| | | | | |
|---|---|---|---|---|
| 10,177,669 | B1 | 1/2019 | Chiu | |
| 10,608,542 | B2 | 3/2020 | Takahara et al. | |
| 2010/0148723 | A1* | 6/2010 | Cook | G06K 19/07749 320/108 |
| 2014/0203772 | A1* | 7/2014 | Yeo | H02J 50/12 320/108 |
| 2014/0334195 | A1 | 11/2014 | Nussbaum et al. | |
| 2016/0181987 | A1 | 6/2016 | Perreault et al. | |
| 2017/0196057 | A1 | 7/2017 | Han | |
| 2017/0214278 | A1 | 7/2017 | Hosotani | |
| 2017/0302110 | A1* | 10/2017 | Riehl | H02J 50/60 |
| 2017/0324277 | A1 | 11/2017 | Mitcheson et al. | |
| 2020/0083707 | A1 | 3/2020 | VanWyk et al. | |
| 2021/0359544 | A1 | 11/2021 | Avestruz et al. | |

FOREIGN PATENT DOCUMENTS

| | | | |
|---|---|---|---|
| CN | 108321943 | A | 7/2018 |
| CN | 109417312 | A | 3/2019 |
| JP | 2008515379 | A | 5/2008 |
| JP | 2016039709 | A | 3/2016 |
| JP | 2017503459 | A | 1/2017 |
| JP | 2019022265 | A | 2/2019 |
| WO | 2015015720 | A1 | 2/2015 |
| WO | 2016080045 | A1 | 5/2016 |

OTHER PUBLICATIONS

Roslaniec, L. et al. "Design of Single-switch Inverters for Variable Resistance/load Modulation Operation" *IEEE* Power Electron., (Jun. 2015) vol. 30, No. 6, pp. 3200-3214.

Aldhaher, S., Yates, D.C., and Mitcheson, P.D. "Load-independent Class E/EF Inverters and Rectifiers for MHz-Switching Applications" *IEEE Trans.* Power Electron., (Oct. 2018). vol. 33, No. 10, pp. 8270-8287.

Choi, J. et al. "High-frequency, High-power Resonant Inverter with eGaN FET for Wireless Power Transfer" IEEE Trans. Power Electron., (Mar. 2018). vol. 33, No. 3, pp. 1890-1896.

Aldhaher, S. et al. "Light-weight Wireless Power Transfer for Mid-air Charging of Drones" *11th European Conf. Antennas Propagation*, (Mar. 2017), pp. 336-340.

Schuylenbergh, K.V. and Puers, R. "Inductive Powering: Basic Theory and Application to Biomedical Systems" 1st ed. Springer Publishing Company, Incorporated, (2009).

Office Action dated Feb. 27, 2023 for corresponding U.S. Appl. No. 17/018,328.

Notice of Allowance dated Jun. 13, 2023 for corresponding U.S. Appl. No. 17/018,328.

Aldhaher, S. "Design and Optimization of Switched-Mode Circuits for Inductive Links" *School of Engineering Energy & Power Engineering Division*. (Jan. 2014).

Pinuela, M. "Maximizing DC-to-Load Efficiency for Inductive Power Transfer" *IEEE Transactions on Power Electronics*, (May 2013). vol. 28, No. 5, pp. 2437-2447.

Lenaerts, B. and Puers, R. "Omnidirectional Inductive Powering for Biomedical Implants" *Springer Science + Business Media B.V.* (2009) pp. 39-81.

Office Action dated Oct. 10, 2023 for corresponding EP Patent Application No. 20864054.0-1202.

Aldhaher Samer et al: "500W 13.56MHz Class EF Push-pull Inverter for Advanced Dynamic Wireless Power Applications", 2019 IEEE PELS Workshop on Emerging Technologies: Wireless Power Transfer (WOW), IEEE, Jun. 18, 2019 ( Jun. 18, 2019), pp. 263-267, XP033738632, DOI: 10.1109/WOW45936.2019.9030603 [retrieved on Mar. 9, 2020].

Wang Zheng-Shi et al: "Zero-voltage switching converter absorbing parasitic parameters for super high frequency induction heating", Journal of Zhejiang University Science A, Zheijiang University Press, CN, vol. 9, No. 4, Apr. 1, 2008 ( Apr. 1, 2008), pp. 564-571, XP036040375, ISSN: 1673-565X, DOI: 10.1631/JZUS.A071177 [retrieved on Apr. 1, 2008].

Katayama, Motoki and Sekiya H; Yahagi T, "An Interleaved Class E2 dc/dc Converter", 2008 IEEE International Symposium on Circuits and Systems, (Jun. 13, 2008), doi:10.1109/ISCAS.2008.4542047, pp. 2833-2836, XP031272083.

International Search Report for Application PCT/CA2020/051226 mailed Dec. 1, 2020.

* cited by examiner

HIGH FREQUENCY WIRELESS POWER TRANSFER SYSTEM, TRANSMITTER AND RECEIVER THEREFOR

RELATED APPLICATION

This application is a continuation of and claims priority to U.S. patent application Ser. No. 17/018,328 filed on Sep. 11, 2020, which claims the benefit of U.S. Provisional Application No. 62/899,165 filed on Sep. 12, 2019, the entire contents of each of which are hereby incorporated by reference.

FIELD

The subject disclosure relates generally to wireless power transfer and in particular, to a high frequency wireless power transfer system, transmitter and receiver therefor.

BACKGROUND

Wireless charging and wireless power transfer systems are becoming an increasingly important technology to enable the next generation of devices. The potential benefits and advantages offered by the technology is evident by the increasing number of manufacturers and companies investing in the technology.

A variety of wireless power transfer systems are known. A typical wireless power transfer system includes a power source electrically connected to a wireless power transmitter, and a wireless power receiver electrically connected to a load.

In magnetic induction systems, the transmitter has a coil with a certain inductance that transfers electrical energy from the power source to a receiving coil with a certain inductance. Power transfer occurs due to coupling of magnetic fields between the inductors of the transmitter and receiver. The range of these magnetic induction systems is limited, and the inductors of the transmitter and receiver must be in optimal alignment for power transfer.

There also exist resonant magnetic systems in which power is transferred due to coupling of magnetic fields between the inductors of the transmitter and receiver. In resonant magnetic systems the inductors are resonated using at least one capacitor. In resonant magnetic systems, the transmitter is self-resonant and the receiver is self-resonant. The range of power transfer in resonant magnetic systems is increased over that of magnetic induction systems and alignment issues are rectified. While electromagnetic energy is produced in magnetic induction and resonant magnetic systems, the majority of power transfer occurs via the magnetic field. Little, if any, power is transferred via electric induction or resonant electric induction.

The Qi wireless charging standard is an exemplary implementation of a magnetic induction system. The Qi wireless charging standard is used in low power consumer electronics such as smart phones and wearable devices. Furthermore, low cost power converters, coils and integrated circuit are available for use in the Qi wireless charging standard. The Qi wireless charging standard operates in the kHz frequency range. Accordingly, devices operating according to the Qi wireless charging standard have limited coupling range, require precise coil alignment and use ferrite-based coils, which can be heavy and fragile. Consequently, the application scope of the Qi wireless charging standard is limited.

In electric induction systems, the transmitter and receiver have capacitive electrodes. Power transfer occurs due to coupling of electric fields between the capacitive electrodes of the transmitter and receiver. Similar, to resonant magnetic systems, there exist resonant electric systems in which the capacitive electrodes of the transmitter and receiver are made resonant using at least one inductor. In resonant electric systems, the transmitter is self-resonant and the receiver is self-resonant. Resonant electric systems have an increased range of power transfer compared to that of electric induction systems and alignment issues are rectified. While electromagnetic energy is produced in electric induction and resonant electric systems, the majority of power transfer occurs via the electric field. Little, if any, power is transferred via magnetic induction or resonant magnetic induction.

Applications of magnetic and electric induction systems, commonly referred to as inductive power transfer (IPT) systems, may operate in the tens of MHz frequency range. In the tens of MHz frequency range, the topology of direct current (DC) to alternating current (AC) inverters used in transmitters of these systems are generally based on Class E or Class $EF_2$ inverter configurations. While these configurations are power efficient and simple to construct, optimum switching operation may only be maintained for a fixed load. Therefore, such configurations are highly dependent on the fixed load. Consequently, IPT systems using Class E or Class $EF_2$ inverters generally only operate efficiently at a fixed coil separation distance and through a narrow load range.

As described in "Load-independent Class E Power Inverters: Part I. Theoretical Development" authored by R. E. Zulinski and K. J. Grady IEEE Trans. Circuits Syst. I, Reg. Papers, vol. 37, no. 8, pp. 1010-1018, August 1990 and "Design of Single-switch Inverters for Variable Resistance/load Modulation Operation" authored by L. Roslaniec, A. S. Jurkov, A. Al Bastami, and D. J. Perreault in IEEE Trans. Power Electron., vol. 30, no. 6, pp. 3200-3214, June 2015, the relevant portions of which are incorporated herein by reference, Class E and Class $EF_2$ inverters may be designed such that they achieve zero-voltage switching (ZVS) and produce a constant output voltage as the load resistance varies when used with a finite DC inductor instead of a choke.

Such designs may extend the load range that Class E or Class $EF_2$ inverters may operate efficiently from infinite load resistance (open circuit) to a certain minimum load resistance. While these designs may be applied to several applications, such as high frequency DC/DC converters, they cannot generally be used efficiently in IPT systems where the distance changes between the coils/electrodes. In IPT systems, the load ranges from zero resistance (short circuit) when the coils/electrodes are completely separated from each other to a certain maximum load resistance when the coils/electrodes are closest to each other.

As previously stated, IPT systems may operate in the tens of MHz frequency range. Switching in the tens of MHz frequency range may be achieved by utilizing wide-bandgap devices such as GaN and SiC. As described in "Load-independent Class E/EF Inverters and Rectifiers for MHz-Switching Applications" authored by S. Aldhaher, D. C. Yates, and P. D. Mitcheson in IEEE Trans. Power Electron., vol. 33, no. 10, pp. 8270-8287, October 2018 and "High-frequency, High-power Resonant Inverter with eGaN FET for Wireless Power Transfer" authored by J. Choi, D. Tsukiyama, Y. Tsuruda, and J. M. R. Davila in IEEE Trans. Power Electron., vol. 33, no. 3, pp. 1890-1896, March 2018, the relevant portions of which are incorporated herein by reference, recent developments in resonant converters and soft-switching topologies, such as Class E and Class EF, allow for true exploitation of wide-bandgap devices and give designers topologies and circuit configurations to use for achieving high performance/power density converters.

Operating at the tens of MHz frequency for wireless power transfer increases the maximum air gap distance, improves the tolerance to coil misalignment and therefore, allows a receiver to be placed anywhere in a charging zone without the requirement for precise alignment. This wireless power transfer also allows for high-Q, single-turn air-core coils to be used which are lightweight, compact and could be implemented on low cost FR4 PCBs. Such features were demonstrated by wirelessly powering a miniature drone as described in "Light-weight Wireless Power Transfer for Mid-air Charging of Drones" authored by S. Aldhaher, P. D. Mitcheson, J. M. Arteaga, G. Kkelis, and D. C. Yates in 11th European Conf. Antennas Propagation, March 2017, pp. 336-340, the relevant portions of which are incorporated herein by reference.

Although wireless power transfer techniques are known, improvements are desired. It is therefore an object to provide a novel wireless power transfer system, a transmitter and receiver therefor and a method of wirelessly transmitting power.

SUMMARY

It should be appreciated that this Summary is provided to introduce a selection of concepts in a simplified form that are further described below in the Detailed Description of Embodiments. This Summary is not intended to be used to limit the scope of the claimed subject matter.

Accordingly, in one aspect there is provided a load independent inverter comprising a switched mode zero-voltage switching (ZVS) amplifier comprising: a pair of circuits comprising: at least a transistor and at least a capacitor arranged in parallel; and at least an inductor arranged in series with the transistor and capacitor; only one ZVS inductor connected to the pair of circuits; and at least a pair of capacitors connected to the ZVS inductor and arranged in series with at least an inductor and at least a resistor.

In one or more embodiments, the load independent inverter comprises at least two capacitors connected to the ZVS inductor. In one or more embodiments, the at least two capacitors are arranged in series with the at least one inductor and resistor.

In one or more embodiments, a minimum value of a load resistance normalized to a characteristic impedance of the switched mode ZVS amplifier is between 0.585 and 0.975.

In one or more embodiments, a q value of the load independent inverter is between 0.739 and 1.231.

In one or more embodiments, a residual reactance normalized to a characteristic impedance of the load independent inverter is between 0.194 and 0.323.

In one or more embodiments, a voltage gain value of the load independent inverter is between 2.349 and 3.915.

In one or more embodiments, a normalized output power of the load independent inverter is between 4.700 and 7.834.

In one or more embodiments, the load independent inverter has constant voltage output. In one or more embodiments, the load independent inverter has a load range of 5.625 ohms to an infinite or open circuit load. In one or more embodiments, the load independent inverter further comprises an impedance inverter circuit configured to convert the load independent inverter from constant voltage output to constant current output.

In one or more embodiments, the load independent inverter has a constant current output. In one or more embodiments, the load independent inverter has a load range of zero ohms or a short circuit load to 9.375 ohms.

In one or more embodiments, the load independent inverter is configured to detect a metal object. In one or more embodiments, the load independent inverter further comprises: a peak detection circuit configured to measure a peak value of voltage across a transistor of the load independent inverter; and a comparator configured to compare the peak value of voltage with a threshold voltage and output a detection signal if the peak value of voltage exceeds the threshold voltage. In one or more embodiments, the load independent inverter further comprises: a voltage divider configured to convert the peak value of voltage prior to measurement by the peak detection circuit.

In one or more embodiments, the switched mode ZVS amplifier is a radio frequency (RF) amplifier.

In one or more embodiments, the load independent inverter is a class E inverter.

In one or more embodiments, the load independent inverter is a direct current (DC) to alternating current (AC) inverter.

According to another aspect there is provided a transmitter comprising: a load independent inverter comprising a switched mode zero-voltage switching (ZVS) amplifier; and a transmitter coil or electrodes connected to the load independent inverter, the transmitter coil or electrodes configured to transfer power to a receiver via magnetic or electric field coupling.

In one or more embodiments, the transmitter is non-resonant or not self-resonant.

In one or more embodiments, the transmitter coil is configured to transfer power via magnetic field coupling.

In one or more embodiments, the transmitter electrodes are configured to transfer power via electric field coupling.

In one or more embodiments, the transmitter further comprises a power source.

In one or more embodiments, the transmitter further comprises a power converter configured to convert a power signal from the power source prior to receipt by the inverter.

According to another aspect there is provided a wireless power transfer system comprising: a transmitter comprising: a load independent inverter comprising a switched mode zero-voltage switching (ZVS) amplifier; and a transmitter coil or electrodes connected to the load independent inverter, the transmitter coil or electrodes configured to transfer power to a receiver via magnetic or electric field coupling; and the receiver comprising: a receiver coil or electrodes configured to extract power from the receiver via magnetic or electric field coupling.

In one or more embodiments, the transmitter is non-resonant or not self-resonant, and the receiver is resonant. In one or more embodiments, the receiver is resonant at an operating frequency of the transmitter.

In one or more embodiments, the transmitter coil is configured to transfer power via magnetic field coupling and the receiver coil is configured to extract power via magnetic field coupling.

In one or more embodiments, the transmitter electrodes are configured to transfer power via electric field coupling and the receiver electrodes are configured to extract power via electric field coupling.

In one or more embodiments, the receiver further comprises a rectifier connected to the receiver coil or electrodes.

In one or more embodiments, the receiver further comprises a load connected to the receiver coil or electrodes.

BRIEF DESCRIPTION OF THE DRAWINGS

Embodiments will now be described more fully with reference to the accompanying drawings in which.

DETAILED DESCRIPTION OF EMBODIMENTS

Figure 1:
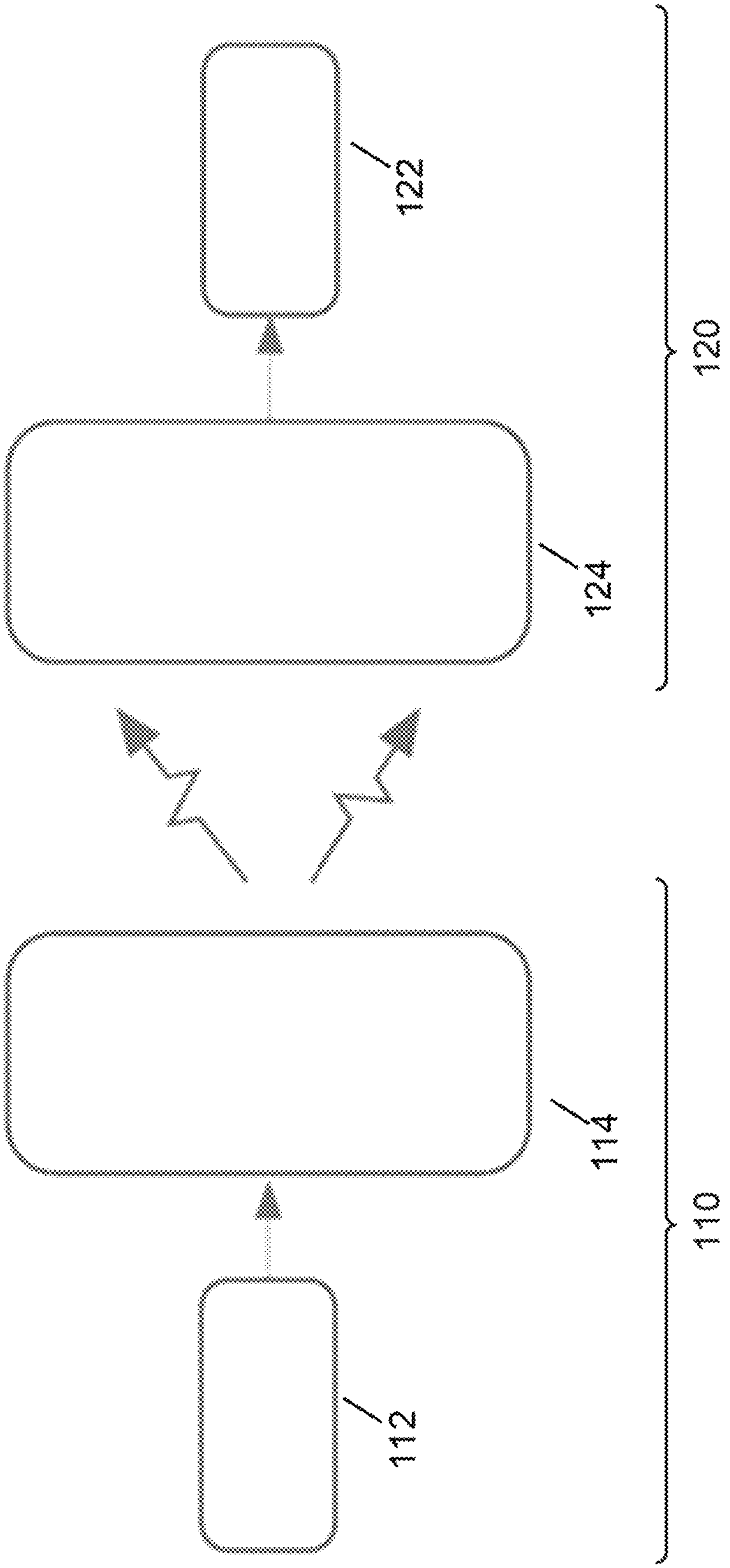
FIG. 1 is a block diagram of a wireless power transfer system.

The foregoing summary, as well as the following detailed description of certain examples will be better understood when read in conjunction with the appended drawings. As used herein, an element or feature introduced in the singular and preceded by the word "a" or "an" should be understood as not necessarily excluding the plural of the elements or features. Further, references to "one example" or "one embodiment" are not intended to be interpreted as excluding the existence of additional examples or embodiments that also incorporate the described elements or features. Moreover, unless explicitly stated to the contrary, examples or embodiments "comprising" or "having" or "including" an element or feature or a plurality of elements or features having a particular property may include additional elements or features not having that property. Also, it will be appreciated that the terms "comprises", "has", "includes" means "including by not limited to" and the terms "comprising", "having" and "including" have equivalent meanings. It will also be appreciated that like reference characters will be used to refer to like elements throughout the description and drawings.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, and/or designed for the purpose of performing the function. It is also within the scope of the subject application that elements, components, and/or other subject matter that are described as being adapted to perform a particular function may additionally or alternatively be described as being configured to perform that function, and vice versa. Similarly, subject matter that is described as being configured to perform a particular function may additionally or alternatively be described as being operative to perform that function.

It will be understood that when an element is referred to as being "on," "attached" to, "connected" to, "coupled" with, "contacting," etc., another element, it can be directly on, attached to, connected to, coupled with or contacting the other element or intervening elements may also be present.

It should be understood that use of the word "exemplary", unless otherwise stated, means 'by way of example' or 'one example', rather than meaning a preferred or optimal design or implementation.

Unless defined otherwise, all technical and scientific terms used herein have the same meaning as is commonly understood by one of skill in the art to which the subject disclosure pertains.

For the purposes of the subject disclosure, switching frequency, $\omega_s$, is defined as the frequency at which switches are turned on and off. The switching frequency may be supplied from an external signal source, such as a function generator, or generated using an oscillator. A switching signal, based on the switching frequency, is the main "clock" of a wireless power transfer system. Therefore, the fundamental frequency components of all other voltage and current signals of related elements will be equal to the switching frequency.

For the purposes of the subject disclosure, resonant frequency, $\omega_o$, is defined as the frequency at which a circuit network has a zero reactive impedance. The resonant frequency of a series LCR circuit is given by equation 1:

$$\omega_o = \frac{1}{\sqrt{LC}} \tag{1}$$

where L is the inductance and C is the capacitance.

The resonant frequency of a parallel RLC circuit is given by equation 2:

$$\omega_o = \sqrt{\frac{1}{LC} - \frac{1}{C^2R^2}} \tag{2}$$

where R is the load. The switching frequency is not necessarily equal to the resonant frequency. Different modes of operation can be obtained by operating an inverter at switching frequencies above, below or equal to the resonant frequency.

For the purposes of the subject disclosure, ZVS is switching of a transistor from an off state to an on state when the voltage across the transistor is zero. Consequently, there is no energy lost during this transition from the off to the on state. In practice, there is some energy lost due to the finite time of the transition period. However, the energy loss is substantially lower than a non-ZVS circuit. ZVS allows for efficient operation of power inverters, especially at MHz frequency ranges. ZVS is achieved by using a combination of passive components such as capacitors and inductors with certain values.

For the purposes of the subject disclosure, characteristic impedance ($Z_o$) of a resonant network of an inverter is given by equation 3:

$$Z_o = \sqrt{\frac{L}{C}} = \omega L = \frac{1}{\omega C} \quad (3)$$

where ω is the frequency, L is the inductance of the resonant network of the inverter and C is the capacitance of the resonant network.

Turning now to FIG. 1, a wireless power transfer system generally identified by reference numeral 100 is shown. The wireless power transfer system 100 comprises a transmitter 110 comprising a power source 112 electrically connected to a transmit element 114, and a receiver 120 comprising a receive element 124 electrically connected to a load 122. Power is transferred from the power source 112 to the transmit element 114. The power is then transferred from the transmit element 114 to the receive element 124 via resonant or non-resonant electric or magnetic field coupling. The power is then transferred from the receive element 124 to the load 122.

Figure 2A:
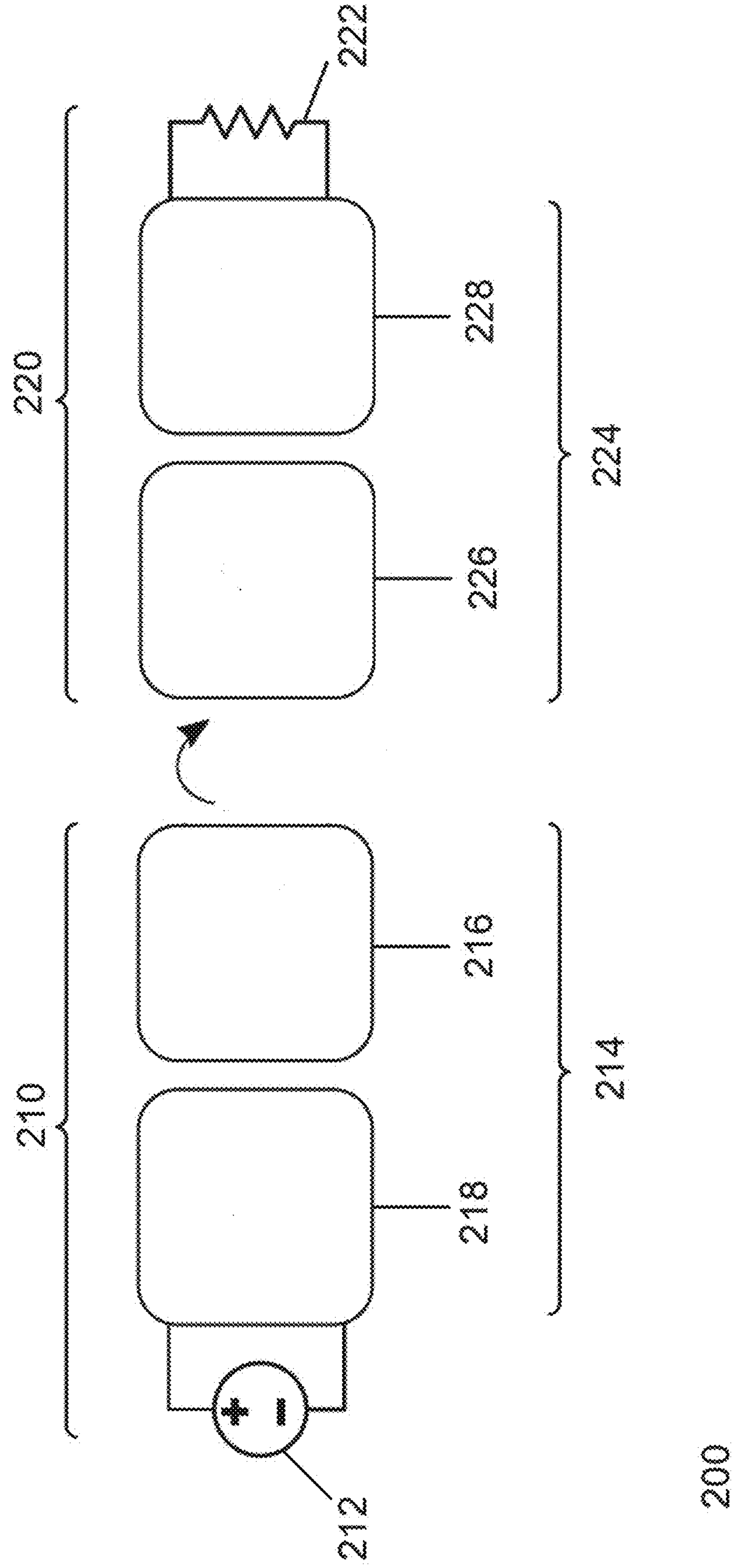
FIG. 2A is a block diagram of a resonant magnetic wireless power transfer system.

Turning now to FIG. 2A, an IPT system is shown. In this embodiment, the IPT system is a resonant magnetic wireless power transfer system generally identified by reference numeral 200. The resonant magnetic wireless power transfer system 200 comprises a transmitter 210 comprising a power source 212 electrically connected to a transmit resonator 214. The transmit resonator 214 comprises a transmit resonator coil 216, electrically connected to the power source 212 via a capacitor 218. The magnetic resonant wireless power transfer system 200 further comprises a receiver 220 comprising a receive resonator 224 electrically connected to a load 222. The receive resonator 224 is tuned to the resonant frequency of the transmit resonator 214. The receive resonator 224 comprises a receive resonator coil 226, which is electrically connected to the load 222 via a capacitor 228.

During operation of the resonant magnetic wireless power transfer system 200, power is transferred from the power source 212 to the transmit resonator coil 216 via the capacitors 218. In particular, the power signal from the power source 212 that is transmitted to the transmit resonator coil 216 via the capacitors 218 excites the transmit resonator 214 causing the transmit resonator 214 to generate a magnetic field. When the receiver 220, which is tuned to the same resonant frequency as the transmitter 210, is placed within the magnetic field, the receive resonator 224 extracts power from the transmit resonator 214 via resonant magnetic field coupling. The extracted power is then transferred from the receive resonator 224 to the load 222. As the power transfer is highly resonant, the transmit resonator and receive resonator coils 216 and 226, respectively, need not be as close together or as well aligned as is the case with a non-resonant magnetic system. While the transmit resonator 214 may generate an electric field, little, if any, power is transmitted via electric field coupling.

Figure 2B:
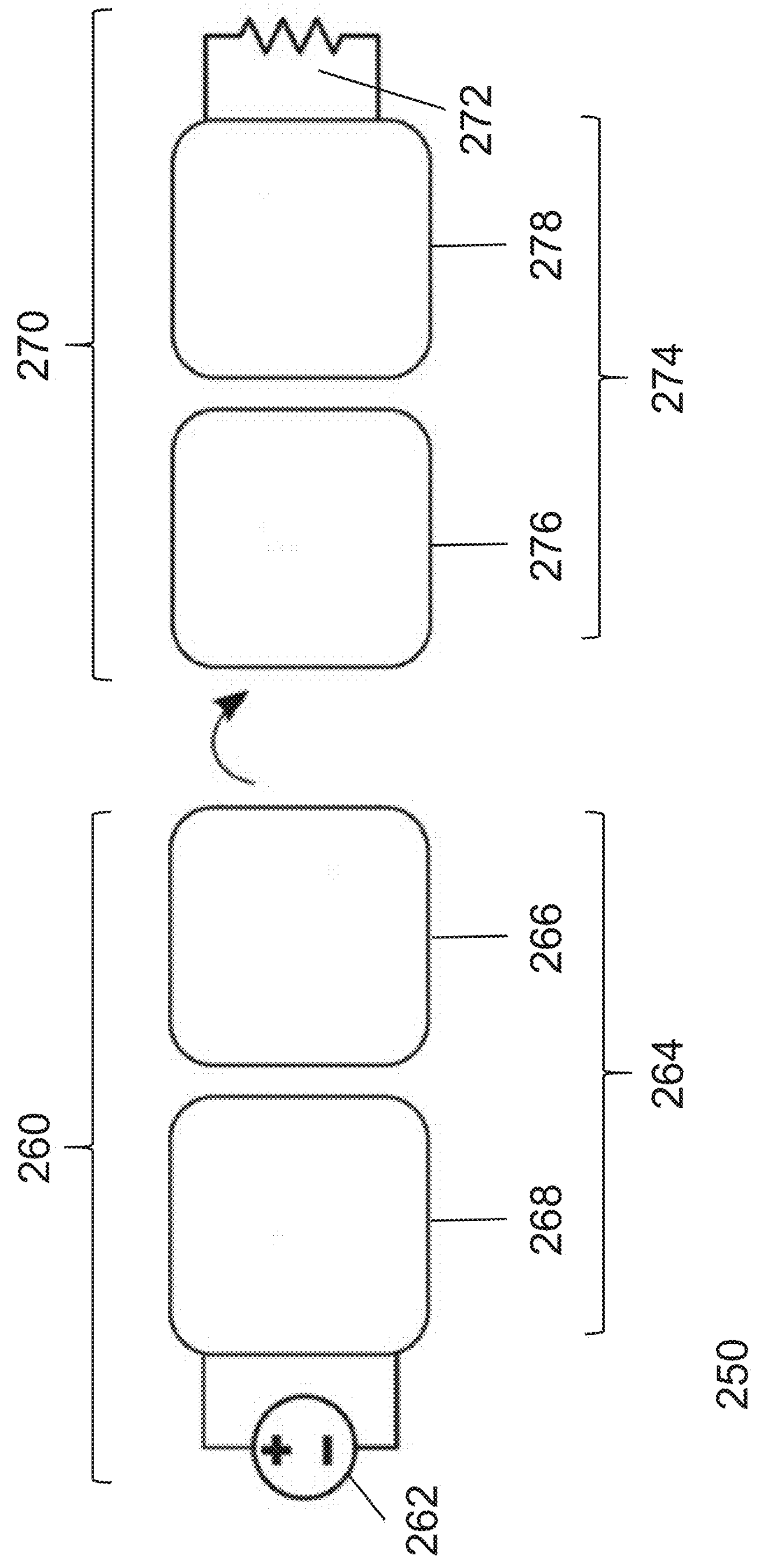
FIG. 2B is a block diagram of a resonant electric wireless power transfer system.

Turning now to FIG. 2B, another IPT system is shown. In this embodiment, the IPT system is a resonant electric wireless power transfer system generally identified by reference numeral 250. The resonant electric wireless power transfer system 250 comprises a transmitter 260 comprising a power source 262 electrically connected to a transmit resonator 264. The transmit resonator 264 comprises transmit resonator electrodes 266, which are electrically connected to the power source 262 via one or more inductors 268. The resonant electric wireless power transfer system 250 further comprises a receive 270 comprising a receive resonator 274 electrically connected to a load 272. The receive resonator 274 is tuned to the resonant frequency of the transmit resonator 264. The receive resonator 274 comprises receive resonator electrodes 276, which are electrically connected to the load 272 via one or more inductors 278.

During operation of the resonant electric wireless power transfer system 250, power is transferred from the power source 262 to the transmit resonator electrodes 266 via the inductors 268. In particular, the power signal from the power source 262 that is transmitted to the transmit resonator electrodes 266 via the inductors 268 excites the transmit resonator 264 causing the transmit resonator 264 to generate an electric field. When the receiver 270, which is tuned to the same resonant frequency as the transmitter 260, is placed within the electric field, the receive resonator 274 extracts power from the transmit resonator 264 via resonant electric field coupling. The extracted power is then transferred from the receive resonator 274 to the load 272. As the power transfer is highly resonant, the transmit resonator and receive resonator electrodes 266 and 276, respectively, need not be as close together or as well aligned as is the case with a non-resonant electric system. While the transmit resonator 264 may generate a magnetic field, little, if any, power is transmitted via magnetic field coupling.

Figure 3:
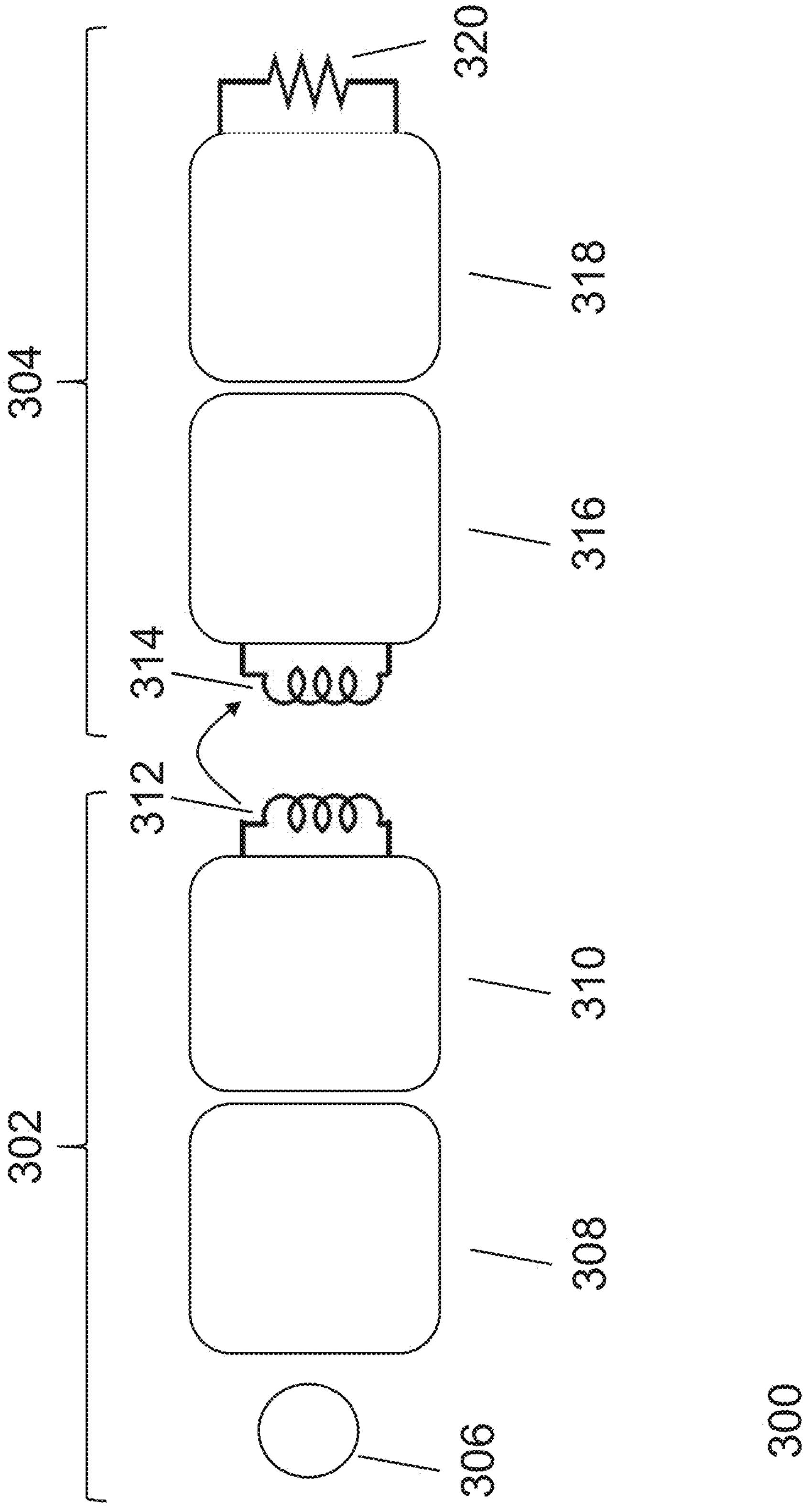
FIG. 3 is a block diagram a high frequency magnetic wireless power transfer system in accordance with an aspect of the subject disclosure.

Turning now to FIG. 3, a high frequency wireless power transfer system in accordance with an aspect of the subject disclosure and generally identified as reference numeral 300 is shown. The high frequency wireless power transfer system 300 comprises a transmitter 302 and a receiver 304. As will be described, the high frequency wireless power system 300 operates by transferring power from the transmitter 302 that is non-resonant or not self-resonant to a receiver 304 resonating at the operating frequency of the transmitter 302.

The transmitter 302 is configured to transmit power wirelessly via high frequency magnetic inductive coupling as will be described. While an electric field may also be generated, little, if any, power is transferred via electric field coupling.

The transmitter 302 comprises a power source 306, a transmitter DC/DC converter 308, a DC/AC inverter 310 and transmitter coil 312. The power source 306 is electrically connected to the transmitter DC/DC converter 308. The power source 306 is configured to generate a DC power signal. The power source 306 is configured to output the DC power signal to the transmitter DC/DC converter 308. In this embodiment, the DC power signal is between 24 V and 48 V. The transmitter DC/DC converter 308 is electrically connected to the power source 306. The transmitter DC/DC converter 308 is electrically connected to the DC/AC inverter 310. The transmitter DC/DC converter 308 interfaces the power source 306 to the DC/AC inverter 310. The transmitter DC/DC converter 308 is configured to convert the DC power signal from the power source 306 to a voltage level for transmission to the DC/AC inverter 310.

The DC/AC inverter 310 is electrically connected to the transmitter DC/DC converter 308. The DC/AC inverter 310 is electrically connected to the transmitter coil 312. The DC/AC inverter 310 is configured to convert the DC power signal from the transmitter DC/DC converter 308 into a sinusoidal radio frequency (RF) power signal. The sinusoidal RF power signal is output from the DC/AC converter 310 to the transmitter coil 312.

While the transmitter 302 has been described as comprising the transmitter DC/DC converter 308, one of skill in the art will appreciate that other configurations are possible. In another embodiment, the transmitter 302 does not comprise the transmitter DC/DC converter 308. In this embodiment, the power source 306 is electrically connected to the DC/AC inverter 310. The power source 306 is configured to generate a DC power signal that is acceptable to the DC/AC inverter 310.

The receiver 304 is configured to extract power from the transmitter 302 via high frequency magnetic inductive coupling as will be described. While an electric field may also be generated, little, if any, power is extracted via electric field coupling.

The receiver 304 comprises a receiver coil 314, an AC/DC rectifier 316, a receiver DC/DC converter 318 and a load 320. The receiver coil 314 is electrically connected to the AC/DC rectifier 316. The receiver coil 314 is configured to receive power from the transmitter 302 via the transmitter coil 312 using high frequency magnetic coupling. In this embodiment, the receiver coil 314 has identical dimensions and number of turns as the transmitter coil 312.

The AC/DC rectifier 316 is electrically connected to the receiver coil 314. The AC/DC rectifier 316 is electrically connected to the receiver DC/DC converter 318. The AC/DC rectifier 316 is configured to convert sinusoidal RF power signal from the receiver coil 314 to a DC power signal. The AC/DC rectifier 316 is configured to output the DC power signal to the receiver DC/DC converter 318.

The receiver DC/DC converter 318 is electrically connected to the AC/DC rectifier 316. The receiver DC/DC converter 318 is electrically connected to the load 320. The DC power signal is output from the AC/DC rectifier 316 to the receiver DC/DC converter 318. The receiver DC/DC converter 318 interfaces the AC/DC rectifier 316 to the load 320. The receiver DC/DC converter 318 is configured to convert the received DC power signal. The converted DC power signal is output from the receiver DC/DC converter 318 to the load 320. The load 320 is electrically connected to the receiver DC/DC converter 318. The load 320 may be a fixed or a variable load.

While the receiver 304 has been described as comprising the receiver DC/DC converter 318, one of skill in the art will appreciate that other configurations are possible. In another embodiment, the receiver 304 does not comprise the receiver DC/DC converter 318. In this embodiment, the AC/DC rectifier 316 is electrically connected to the load 320. The AC/DC rectifier 316 is configured to generate a DC power signal that is acceptable to the load 320.

The transmitter 302 operates at a given frequency. In this embodiment, the operating frequency of the transmitter 302 is 13.56 MHz. Furthermore, in this embodiment, the transmitter coil 312 and receiver coil 314 each have dimensions of 23.4 cm×26.2 cm. The coils 312 and 314 each consist of two turns of copper traces having a width of 14 mm on a FR4 printed circuit board (PCB). The coils 312 and 314 have an inductance of approximately 1.50 uH. The reflected load seen by the transmitter coil 312 varies from 0 ohms, at no load 320, to 7 ohms at full load 320. The maximum power required by the load 320 is 30 W.

The receiver 304 operates at a given frequency. In this embodiment, the operating frequency of the receiver 304 is the operating frequency of the transmitter 302. In this embodiment, the operating frequency of the receiver 304 is 13.56 MHz.

As previously stated, the DC/AC inverter 310 is configured to convert the DC power signal from the transmitter DC/DC converter 308 into a sinusoidal RF power signal. The sinusoidal RF power signal is output from the DC/AC converter 310 to the transmitter coil 312.

In particular, the DC/AC inverter 310 drives the transmitter coil 312 with a sinusoidal alternating current (AC). The transmitter coil 312 is configured to generate an inductive (magnetic) field and to transfer power via high frequency inductive (magnetic) field coupling. The DC/AC inverter 310 takes a DC input voltage and converts it to a high frequency AC current to drive the transmitter coil 312.

The DC/AC inverter 310 is affected by changes to loading conditions, changes in geometry of the system 300 and external distances (i.e. environmental effects), such as the presence of metallic objects near the system 300. It is desirable therefore that the DC/AC inverter 310 is robust and tolerant to these changes and also that the DC/AC inverter 310 operates in MHz frequencies.

As previously stated, Class E and Class $EF_2$ inverters may be designed such that they achieve ZVS and produce a constant output voltage as the load resistance varies when used with a finite DC inductor instead of a choke. Such designs may extend the load range that Class E or Class EF2 inverters may operate efficiently from infinite load resistance (open circuit) to a certain minimum load resistance. While these designs may be applied to several applications, such as high frequency DC/DC converters, they cannot generally be used efficiently in the high frequency wireless power transfer system 300 as the distance changes between the coils 312 and 314, and as the load ranges from zero resistance (short circuit) when the coils 312 and 134 are completely separated from each other to a certain maximum load resistance when the coils 312 and 314 are closest to each other.

Furthermore, in some applications of IPT systems that operate at tens of MHz, the topology of the DC/AC inverter 310 is based on a Class E or Class E2 configuration as described in "Load-independent Class E/EF Inverters and Rectifiers for MHz-Switching Applications" authored by S. Aldhaher, D. C. Yates, and P. D. Mitcheson in IEEE Trans. Power Electron., vol. 33, no. 10, pp. 8270-8287, October 2018 and "Maximizing DC-to-load Efficiency for Inductive Power Transfer" authored by M. Pinuela, D. C. Yates, S. Lucyszyn, and P. D. Mitcheson in IEEE Trans. Power Electron., vol. 28, no. 5, pp. 2437-2447, May 2013, the relevant portions of which are incorporated herein by reference. While these configurations are power efficient and simple to construct, they can only maintain their optimum switching operation for a fixed load and therefore are highly dependent on the load value.

Consequently, this limits an IPT system with a Class E or Class $EF_2$ DC/AC inverter to function efficiently only at a fixed coil separation distance and for a narrow load range.

To overcome the previously discussed challenges when using inverters based on Class E or Class $EF_2$ configurations, and to allow for variable distance between the transmitter and receiver coils 312 and 314, the DC/AC inverter 310 is load independent. The load independent DC/AC inverter 310 allows Class E and Class EF inverters to maintain efficient operation by achieving ZVS regardless of the load resistance value. In addition, unlike the typical Class E and Class $EF_2$, the load independent Class E and Class EF inverters can deliver a constant output AC voltage or current that does not change with load which is more suitable for IPT applications.

A discussion of the efficiency of the coupling and/or inductive link between the coils 312 and 314 is beneficial when considering the design of the DC/AC inverter 310. As previously stated, the high frequency wireless power transfer system 300 comprises the transmitter 302 and the receiver 304. The transmitter 302 comprises, among other elements, the transmitter coil 312, and the receiver 304 comprises, among other elements, the receiver coil 314.

The coils 312 and 314 are separated from each other by a certain gap. The transmitter coil 312 is driven with a sinusoidal AC at a certain fixed frequency, the operating frequency of the transmitter 302. An alternating magnetic field is generated which couples to the receiver coil 314 and induces a sinusoidal voltage across the terminals of the receiver coil 314 with the same frequency of the current in the transmitter coil 312. Any load connected across the terminals of the receiver coil 314, such as the load 320, will result in electric current flowing into the load. A coupling coefficient k indicates the amount of coupling between the two coils 312 and 314, as defined in equation 4:

$$k = \frac{M}{\sqrt{L_p L_s}} \tag{4}$$

where is $L_p$ is the inductance of the transmitter coil 312, $L_s$ is the inductance of the receiver coil 314 and M is the mutual inductance between the coils 312 and 314.

Figure 4A:
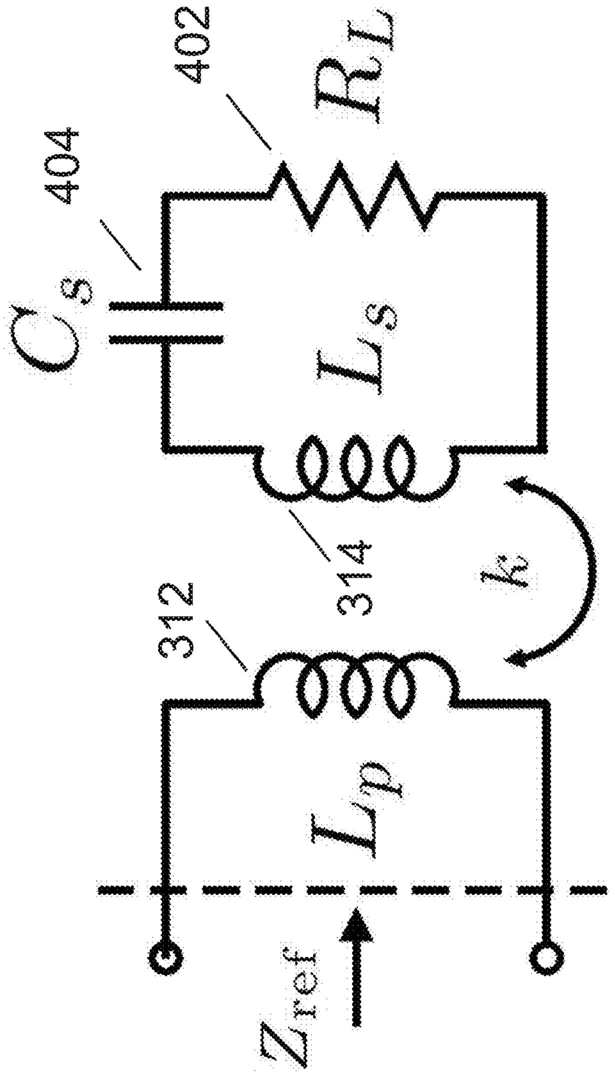
FIG. 4A is a partial schematic layout of the inductive link of the high frequency magnetic wireless power transfer system of FIG. 3.

Turning now to FIG. 4A, a partial schematic layout of the inductive link of the high frequency magnetic wireless power transfer system 300 is shown. FIG. 4A includes a circuit representation of the two coupled coils 312 and 314. A resistor 402 with a resistance $R_L$ represents the AC load resistance. A capacitor 404 with a capacitance $C_s$ is connected in series with the receiver coil 314 in order to resonate the receiver coil 314 at the operating frequency. The reflected impedance, $Z_{Ref}$, seen by the transmitter coil 312 is given by equation 5:

$$Z_{Ref} = \frac{\omega^2 M^2}{R_L + jX_{L_s} - jX_{C_s}}. \tag{5}$$

where M is the mutual inductance between the coils 312 and 314, ω is the operating frequency, $jX_{Ls}$ is the impedance of the receiver coil 314 at the frequency of operation and $jX_{Cs}$ is the impedance of the series capacitor 404 at the frequency of operation.

The reflected impedance is a measure of how much of the actual load is seen by the transmitter 302. It is a function of the mutual inductance between the coils 312 and 314, which is affected by the distance between the coils 312 and 314. The closer the coils 312 and 314 are to each other, the higher the mutual inductance and the higher the reflected impedance. The further apart the coils 312 and 314 are from each other, the lower the mutual inductance and the lower the reflected impedance.

As shown in equation 5, the reflected impedance is inversely proportional to the load resistance and magnitude of the impedance of the receiver coil 314. Maximizing the reflected impedance allows for power to be delivered to the load 320 at lower currents. Furthermore, the DC/AC inverter 310 can operate at lower currents, and hence has lower conduction and ohmic losses and high efficiency.

The reflected impedance of equation 5 may be maximized by cancelling the reactance term $X_{LS}$ of the receiver coil 314. The reactance term reflects a resistive load to the transmitter 302. This can be done at the operating frequency by setting the reactance term to be equal to $1/(\omega^2 L_s)$. With this capacitance value, equation 5 becomes equation 6:

$$Z_{Ref} = R_{Ref} = \frac{\omega^2 M^2}{R_L}. \tag{6}$$

Figure 4B:
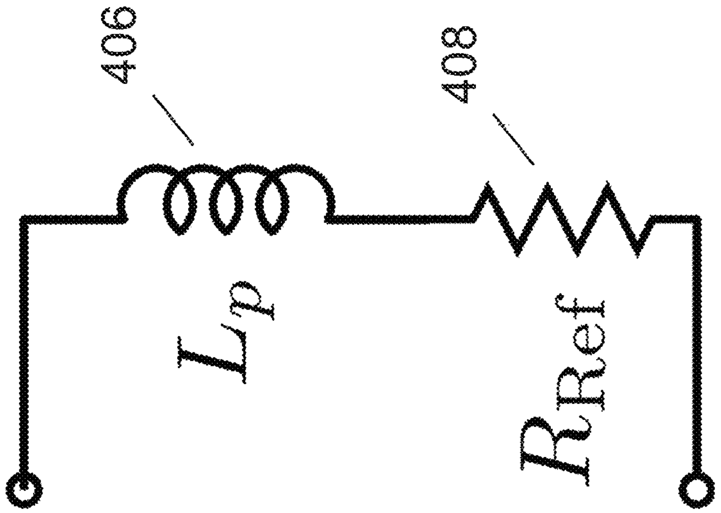
FIG. 4B is a partial schematic layout of the equivalent circuit seen by the transmitter of the high frequency magnetic wireless power transfer system of FIG. 3.

Turning now to FIG. 4B, a partial schematic layout of the equivalent circuit seen by the transmitter 302 of the high frequency magnetic wireless power transfer system 300 is shown. FIG. 4B shows the equivalent circuit of the transmitter coil 312 when operating with a receiver coil 314 tuned at resonance (i.e. $jX_{Ls}=jX_{Cs}$). The circuit comprises an inductor 406 with an inductance $L_p$ and a resistor 408 with a resistance $R_{Ref}$. As seen in equation 6, when using series resonance, the reflected impedance remains resistive regardless of the load resistance value. This is unlike the case with a parallel tuned receiver coil 314 or secondary coil as described in "Inductive Powering: Basic Theory and Application to Biomedical Systems" authored by K. V. Schuylenbergh and R. Puers, 1st ed. Springer Publishing Company, Incorporated, 2009, the relevant portions of which are incorporated herein by reference.

Reflected impedance remains resistive ensuring that DC/AC inverter 310 is not detuned away from optimum operating conditions. Series resonance, however, can limit the maximum frequency of operation as the parasitic capacitance of the receiver coil 314 is not absorbed into the capacitor $C_s$ that is resonant during operation.

As previously stated, while the receiver coil 314 may be operating at resonance or near resonance, the transmitter coil 312 is not operating at resonance (i.e. the transmitter coil 312 is not self-resonant). This is in contrast to many IPT systems where the transmitter coil 312 is operating at resonance.

From the above equations, the link efficiency of the high frequency wireless power transfer system 300 may be determined. The link efficiency of the high frequency wireless power transfer system 300 is defined as the power delivered to the AC secondary load (the load 320) divided by the power input to the transmitter coil 312. With the receiver coil 314 operating at resonance and with the optimal load for maximum efficiency, the link efficiency (n) is given by equation 7:

$$\eta = \frac{k^2 Q_{L_p} Q_{L_s}}{\left(1 + \sqrt{1 + k^2 Q_{L_p} Q_{L_s}}\right)} \tag{7}$$

where $Q_{Lp}$ and $Q_{Ls}$ are the unloaded quality factors of the transmitter coil 312 and the receiver coil 314, respectively.

Figure 5:
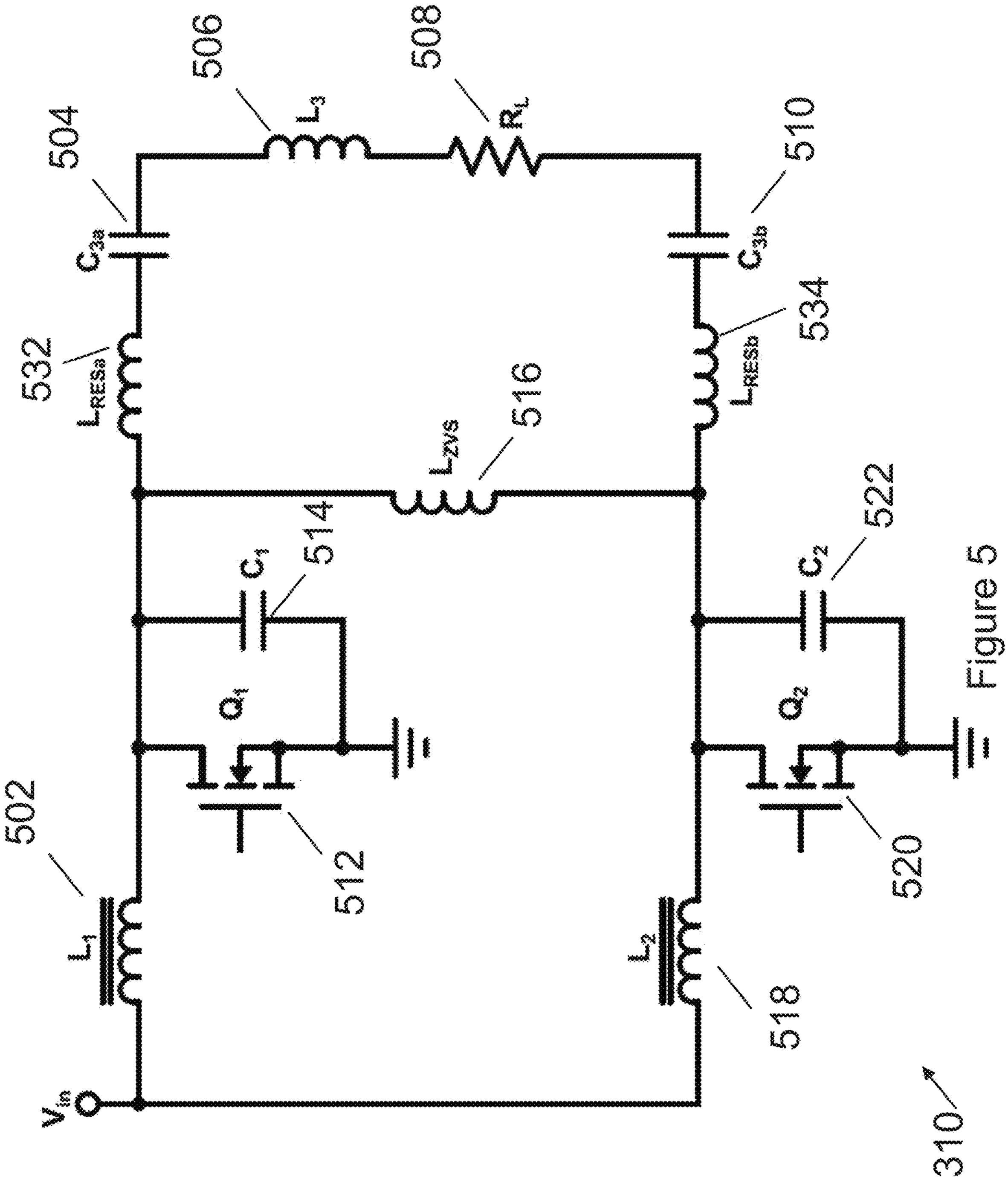
FIG. 5 is a schematic layout of the DC/AC inverter of the high frequency magnetic wireless power transfer system of FIG. 3.

Turning now to FIG. 5, a schematic diagram of the DC/AC inverter 310 of the high frequency magnetic wireless power transfer system 300 is shown. The DC/AC inverter 310 is configured to generate an AC output voltage with a constant amplitude regardless of load whilst maintaining ZVS.

As previously stated, the DC/AC inverter 310 is load independent. In this embodiment, the DC/AC inverter 310 is a push-pull inverter. In this embodiment, the DC/AC inverter 310 is a class E inverter. The DC/AC inverter 310 has a voltage-mode output. Voltage-mode output indicates that the DC/AC inverter 310 has a constant voltage output.

The DC/AC inverter 310 comprises a switched mode ZVS amplifier as will be described. The amplifier is a radio frequency (RF) amplifier.

As shown in FIG. 5, the switched mode ZVS amplifier comprises series inductors 502 and 518 with inductances $L_1$ and $L_2$, respectively, that receive an input voltage $V_{in}$. Each inductor 502, 518 is connected in series to a combination of a transistor 512 and 520 ($Q_1$ and $Q_1$), respectively, (or switch) and capacitor 514 and 522. The capacitors 514 and 522 have capacitances $C_1$ and $C_2$, respectively. Specifically, transistor 512 and capacitor 514 are arranged in parallel, and are connected to inductor 502. Transistor 520 and capacitor 522 are arranged in parallel and are connected to inductor 518. Both transistor 512, 520 and capacitor 514, 522 pairs are grounded. Inductor 516 with inductance $L_{ZVS}$ is connected in parallel between the inductors 502 and 518. Inductor 532 with inductance $L_{RESa}$, capacitor 504 with capacitance $C_{3a}$, inductor 506 with inductance $L_3$, resistor 508 with resistance $R_L$, capacitor 510 with capacitance $C_{3b}$, and inductor 534 with inductance $L_{RESb}$ are arranged in series and connected in parallel to inductor 516. Inductor 506 represents the inductance of the transmitter coil 312 and resistor 508 represents the reflected load of the receiver coil 314. Inductors 532, 534 represent the residual inductance of the receiver coil 314.

The state-space modelling approach as described in "Design and optimization of switched-mode circuits for inductive links" authored by S. Aldhaher in Ph.D. dissertation, Cranfield University, 2014, the relevant portions of which are incorporated herein by reference, was used in order to derive the design equations for the DC/AC inverter 310.

Figure 6:
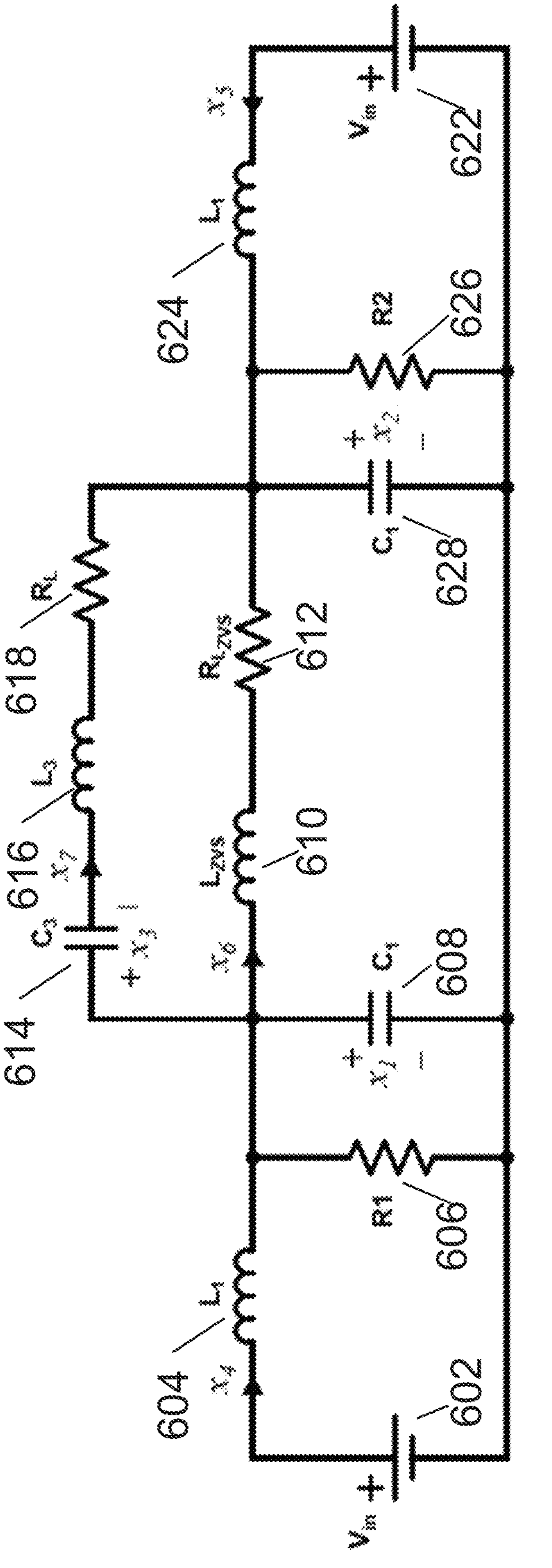
FIG. 6 is an equivalent circuit of the DC/AC inverter of FIG. 5.

An equivalent circuit of the DC/AC inverter 310 illustrated in FIG. 5 was produced as per the state-space modelling approach. Turning now to FIG. 6, the equivalent circuit of the DC/AC inverter 310 is shown. As shown in FIG. 6, two voltage sources 602 and 622 with voltages $V_{in}$ feed signals into two inductors 604 and 624 with inductances $L_1$ on either side of the equivalent circuit. Specifically, one voltage source 602 feeds into one inductor 604, and another voltage source 622 feeds into another inductor 624. Each voltage source 602, 622 and inductor 604, 624 pair is connected to a resistor 606 or 626 having a resistance $R_1$ or $R_2$, respectively, in a parallel arrangement. Each voltage source 602, 622 and inductor 604, 624 pair is further connected to a capacitor 608, 628 in a parallel arrangement. Each capacitor has a capacitance $C_1$. Specifically, the voltage source 602 and inductor 604 pair is connected to resistor 606 and capacitor 608. The other voltage source 622 and inductor 624 pair is connected to resistor 626 and capacitor 628. The inductors 604 and 624 are connected in series to an inductor 610 having an inductance $L_{ZVS}$ and a resistor 612 having a resistance $R_{LZVS}$. The inductor 610 and the resistor 612 are connected in parallel to capacitor 614 having a capacitance $C_3$, inductor 616 having an inductance $L_3$ and resistor 618 having an resistance $R_L$. The capacitor 614, inductor 616 and resistor 618 form an output network. The capacitance $C_3$ of the capacitor 614 is equal to the sum of the capacitance of the capacitors 504 and 510 ($C_{3a}$ and $C_{3b}$) The transistors 512 and 520 of FIG. 5 have been replaced with resistors 606 and 626 having resistances $R_1$ and $R_2$, respectively.

Figure 7:
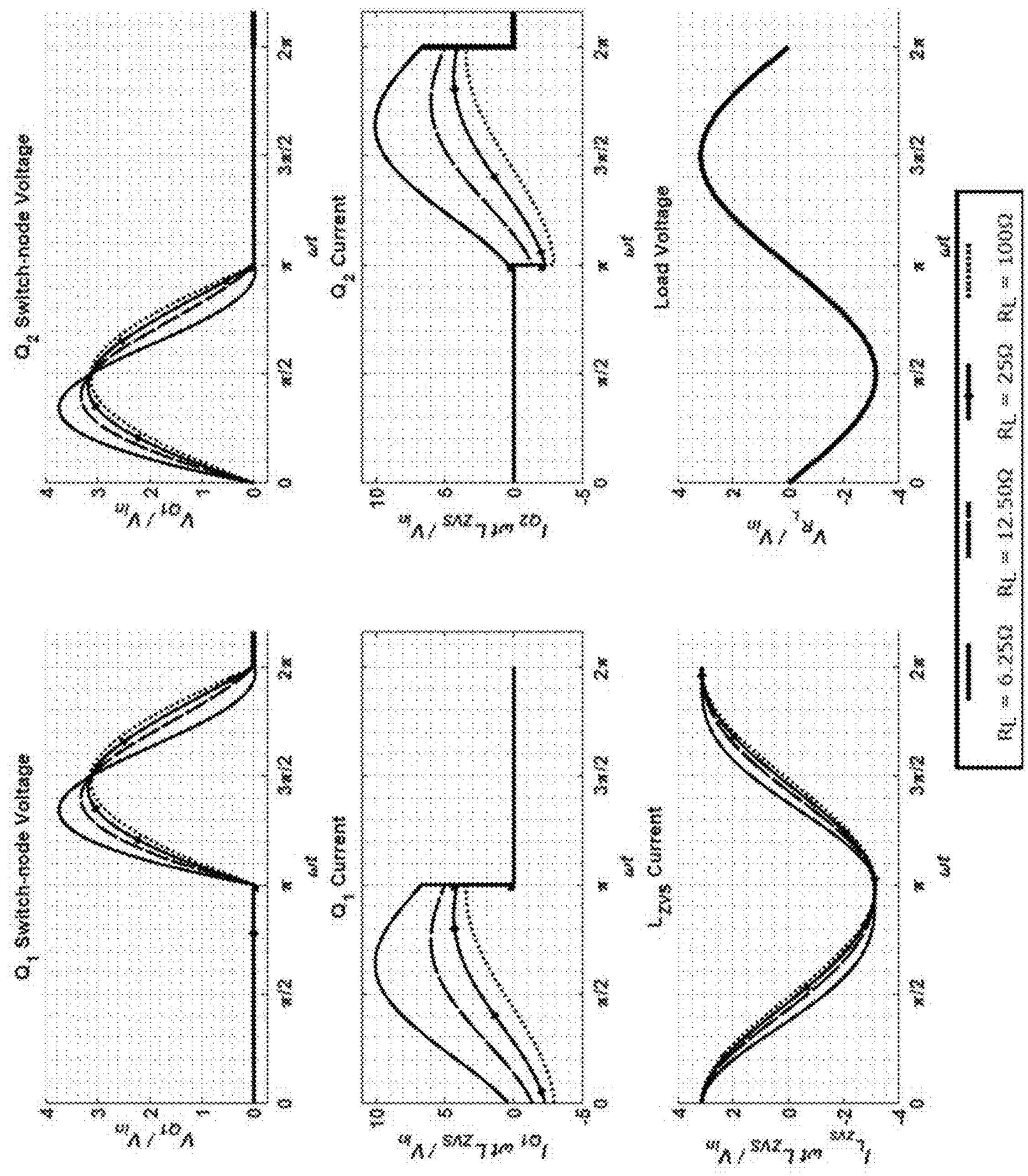
FIG. 7 is a series of graphs of simulations of the equivalent circuit of FIG. 6.

The equivalent circuit of FIG. 6 was simulated for load values $R_L$=6.25, 12.5, 25 and 100 ohms. The results of these simulations are shown in the graphs of FIG. 7. As shown in FIG. 7, the ratio of the voltage of the transistor/switch 512 to the input voltage $V_{in}$ is maximized when the load value $R_L$ is equal to 6.25 ohms. Similarly, the ratio of the voltage of the transistor/switch 520 to the input voltage $V_{in}$ is maximized when the load value $R_L$ is equal to 6.25 ohms.

Furthermore, as shown in FIG. 7, the DC/AC inverter 310 maintains ZVS for different loading conditions from open circuit load condition to minimum load resistance. The amplitude and phase of the output AC voltage across the load remain constant regardless of load value. While the shape of the various waveforms may change, ZVS is generally maintained and the amplitude and phase of the output voltage is generally constant. Additionally, the current in the transistors 512 and 520 at turn off has a negative slope as the load resistance decreases. A negative slope at turn off may minimize the turn off time of the transistors 512 and 520 and may negate the effect of parasitic inductances.

As previously stated, the state-space modelling approach was used to derive design equations for the equivalent circuit of FIG. 6. The design equations discussed may be used to build an AC/DC inverter 310 for a particular set of requirements such as load impedance, resonator impedance, frequency of operation and input DC voltage. The following design equations were derived: q value, residual reactance $X_{res}$, voltage gain, load resistance $R_L$, and output power $P_{out}$.

The q value, which sets the resonant frequency of the DC/AC inverter 310 to the frequency of operation is given by equation 8:

$$q = \frac{1}{\omega\sqrt{L_{ZVS}C_1}} \approx 0.985 \quad (8)$$

The q value is unique to each inverter class and topology. For the operating frequency of 13.56 MHz and optimum performance of the high frequency wireless power transfer system 300, the q value is approximately 0.985. This is expected, as the transmitter 302 is non-resonant (or not self-resonant) so the q value should not be equal to 1.

One of skill in the art will appreciate that the q value may not be exactly equal to and the high frequency wireless power transfer system 300 may still function; however, the load range will be reduced and performance will be negatively affected. In some embodiments, the q value may vary by as much as plus or minus 25% of 0.985 (e.g. approximately 0.739 to 1.231) while still providing acceptable performance.

The output network consisting of the capacitor 614, inductor 616 and resistor 618 with the capacitance $C_3$ of the capacitor 614 being equal to the sum of the capacitance of the capacitor 504 and the capacitor 510 ($C_3=C_{3a}+C_{3b}$) is not tuned to the resonant frequency of the transmitter 302. Consequently, the output network will have a residual reactance $X_{res}$ at the frequency of operation given by equation 9:

$$X_{res} = \omega L_3 - \frac{1}{\omega C_3} \quad (9)$$

Similar to the q value, the value of $X_{res}$ is unique for an inverter class and topology. For the AC/DC inverter 310, the ratio of $X_{res}$ normalized to the characteristic impedance of the inverter 310 is given by equation 10:

$$\boxed{\frac{X_{res}}{Z_0} \approx 0.258} \tag{10}$$

This is expected, as the transmitter 302 is non-resonant (or not self-resonant) so the $X_{res}$ value should not be equal to zero (0). While not described, one of skill in the art will appreciate that a residual inductance may also be present as represented by inductors 532, 534 in FIG. 5.

One of skill in the art will appreciate, that the $X_{res}$ value may not be exactly equal to and the high frequency wireless power transfer system 300 may still function; however, the performance will be negatively affected. In some embodiments, the $X_{res}$ value may vary by as much as plus or minus 25% of 0.258 (e.g. approximately 0.194 to 0.323) while still providing acceptable performance.

The characteristic impedance of the AC/DC inverter 310 is given by equation 11:

$$Z_0 = \sqrt{\frac{L_{ZVS}}{C_1}}.$$

The voltage gain is the ratio of the amplitude of the AC voltage across the load $R_L$ to the input DC voltage $V_{IN}$. For this AC/DC inverter 310, the voltage gain is given by equation 12:

$$\boxed{\frac{V_{R_L}}{V_{IN}} \approx 3.132} \tag{12}$$

For the operating frequency of 13.56 MHz and optimum performance of the high frequency wireless power transfer system 300, the voltage gain is approximately 3.132.

One of skill in the art will appreciate that the voltage gain value may not be exactly equal to 3.132, and the high frequency wireless power transfer system 300 may still function; however, the performance will be negatively affected. In some embodiments, the voltage gain value may vary by as much as plus or minus 25% of 3.132 (e.g. approximately 2.349 to 3.915) while still providing acceptable performance.

As previously stated, the DC/AC inverter 310 has a voltage-mode output, i.e. a constant voltage output. The DC/AC inverter 310 may operate efficiently when the load resistance $R_L$ is in the range of $\{R_{Lmin}, \infty\}$. If the load resistance $R_L$ decreases below $R_{Lmin}$, DC/AC inverter 310 will no longer operate efficiently, i.e. ZVS operation will be lost, and the output voltage of the DC/AC inverter 310 will vary.

This is because the voltage across the transistor will swing below zero volts which in practice means that the body diodes of the transistors $Q_1$ and $Q_2$ will conduct and therefore disrupt the operation of the DC/AC inverter 310. The minimum load resistance $R_{Lmin}$ corresponds to the load at which the DC/AC inverter (when operating at voltage-mode) can deliver the maximum power. Here, the value of $R_{Lmin}$ normalized to the characteristic impedance $Z_0$ is given by equation 13:

$$\boxed{\frac{R_{Lmin}}{Z_0} \approx 0.780.} \tag{13}$$

One of skill in the art will appreciate, that the value of $R_{Lmin}$ normalized may not be exactly equal to 0.780, and the high frequency wireless power transfer system 300 may still function; however, the performance will be negatively affected. In some embodiments, the value of $R_{Lmin}$ normalized may vary by as much as plus or minus 25% of 0.780 (e.g. between 0.585 and 0.975) while still providing acceptable performance.

Combining equations 12 and 13, the output power $P_{out}$ of the DC/AC inverter 310 at a minimum load resistance for a particular input DC voltage may be determined. The output power $P_{out}$ normalized is given by equation 14:

$$\boxed{\frac{Z_0 P_{out}}{V_{IN}^2} = \frac{1}{2}\frac{V_{R_L}^2}{V_{IN}^2}\frac{1}{\frac{R_L}{Z_o}} \approx 6.287 \approx 2\pi} \tag{14}$$

One of skill in the art will appreciate, that the output power $P_{out}$ normalized may not be exactly equal to 6.267, and the high frequency wireless power transfer system 300 may still function; however, the performance will be negatively affected. In some embodiments, the output power $P_{out}$ normalized may vary by as much as plus or minus 25% of 6.267 (e.g. approximately 4.700 to 7.834) while still providing acceptable performance.

Implementing the DC/AC inverter 310 according to the derived design equations yields a DC/AC inverter that is more efficient and robust than other configurations. In particular, Table 1 lists differences between the DC/AC inverter 310 and other configurations.

TABLE 1

| | DC/AC Inverter 310 | GaN based System 1 | GaN based System 2 | GaN based, SiC based System |
|---|---|---|---|---|
| Inverter Topology | Class E | Class $EF_2$ | Class D (H-bridge) | Class EF |
| Switch duty cycle | 50% Fixed | 30% Fixed | 50% Fixed | 30% Fixed |
| Number of switches in push-pull configuration | 2 | 2 | 4 | 2 |
| Deadtime control requirement? | No | No | Yes | No |

TABLE 1-continued

| | DC/AC Inverter 310 | GaN based System 1 | GaN based System 2 | GaN based, SiC based System |
|---|---|---|---|---|
| No of resonant inductors in push-pull configuration (exc. filters) | 1 | 6 | 2 | 2 |
| Voltage stress | 3-4 times input voltage | 2-3 times input voltage | 1 times input voltage | 2-3 times input voltage |
| Current stress | 2-3 times input current | 3-4 times input current | 2-3 times input current | 3-4 times input current |
| Inverter Output type | Constant voltage (uses impedance inverter to convert to constant current) | Almost constant current | Almost constant current | Constant current |
| Control/feedback requirement? | No | Yes | Yes | No |
| Requires Electromagnetic Interference (EMI) filter? | Significantly less EMI filters than known solutions | Requires significant EMI filtering | Requires EMI filters | Requires significant EMI filtering |
| Frequency range | Up to 27.12 MHz | 6.78 MHz | 6.78 MHz | 13.56 MHz |
| Load impedance range | 0-50 Ohms | 30 Ohm optimal | 0-50 Ohms | 0-10 Ohms |
| Semiconductor technology | Si, GaN, SiC | GaN | GaN | GaN, SiC |
| Multiple RX support | Inherently supports multiple Receivers | Increased complexity | Increased complexity | Inherently supports multiple Receivers |
| Dynamic wireless power? | Inherently allows for dynamic WPT | Fixed position, requires increased complexity | Fixed position, requires increased complexity | Inherently allows for dynamic WPT |
| Can discriminate between changes in load and metal objects? | Inherently Yes, as described in text above | No, requires extra circuit complexity | No, requires extra circuit complexity | Inherently Yes, however requires additional circuitry |
| Power Throughput Control | Done at Receiver side by changing coupling and load | Power is controlled by adjusting the operation of Transmitter and Receiver electronics | Power is controlled by adjusting the operation of Transmitter and Receiver electronics | Done at Receiver side by changing coupling and load |

In operation, the DC/AC inverter 310 generates a constant AC voltage or current that does not change with load. As previously stated, in this embodiment, the DC/AC inverter 310 has a voltage-mode output, so constant AC voltage is generated.

The reflected resistance of DC/AC inverter 310 is zero (0) when there is no coupling between the transmitter coil 312 and receiver coil 314 or when the receiver 304 is unloaded. However, in operation, reflected resistance is present as there is coupling between the coils 312 and 314. Specifically, as the coupling between the coils 312 and 314 increases, the reflected resistance increases. A current sense and feedback system may be used to regulate the output current of the DC/AC inverter 310.

As will be described, alternatively to a current sense and feedback system, the voltage-mode output (constant voltage output) may be converted to a current-mode output (constant current output) in order to remove reflected resistance.

Figure 8:
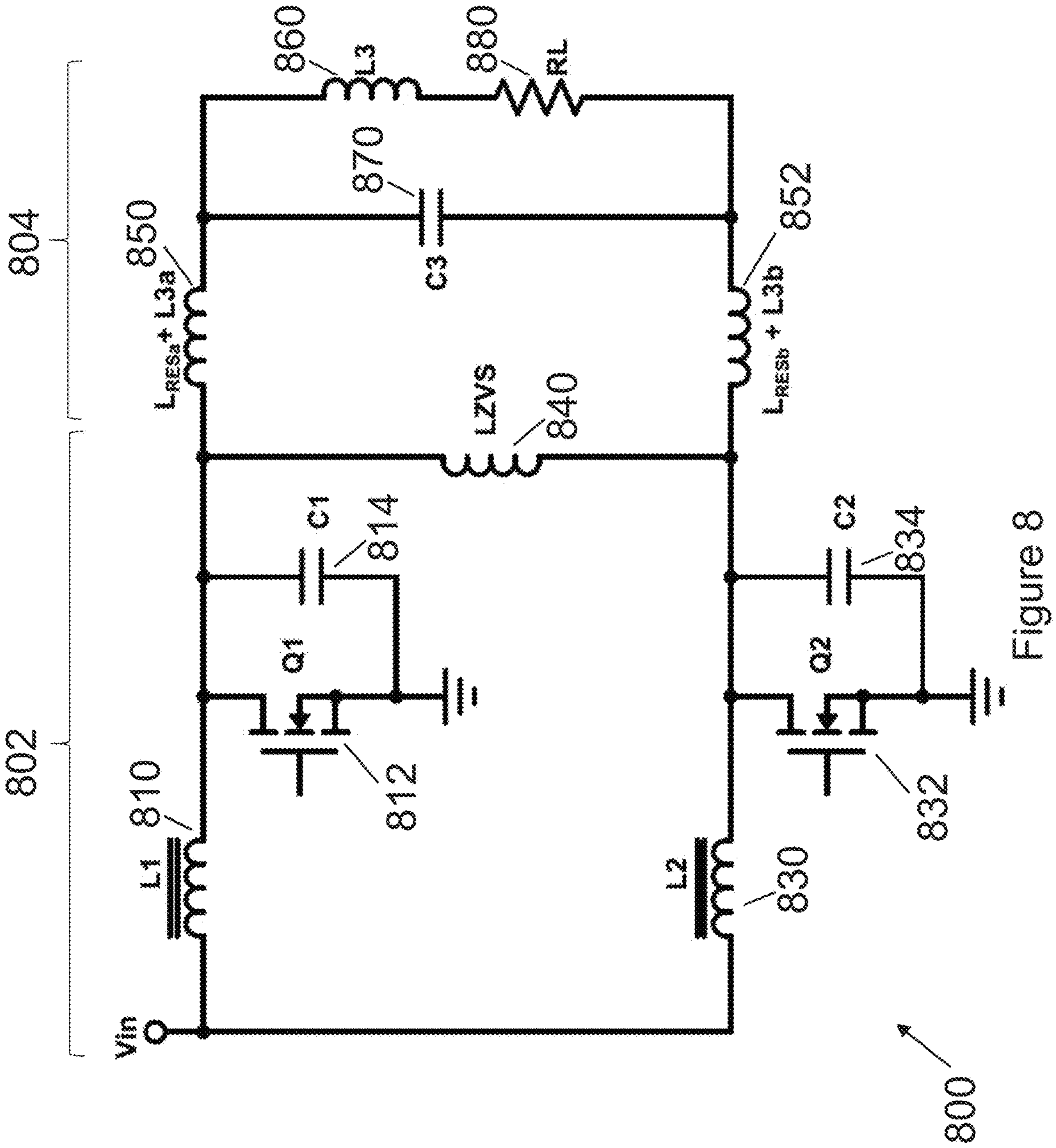
FIG. 8 is a schematic layout of another embodiment of the DC/AC inverter of FIG. 5.

While a particular DC/AC inverter 310 has been described, one of skill in the art will appreciate that other configurations are possible. Turning now to FIG. 8, a schematic layout of another embodiment of the DC/AC inverter generally identified by reference numeral 800 is shown. In this embodiment, the DC/AC inverter 800 comprises a load independent circuit 802 and an impedance inverter circuit 804. The DC/AC inverter 800 is current-mode output (constant output current).

The load independent circuit 802 is configured to convert an input DC signal into an output AC signal. The load independent circuit 802 is voltage-mode output (constant output voltage). The load independent circuit 802 comprises inductors 810, 830 having inductances $L_1$ and $L_2$, respectively that receive an input voltage having a voltage $V_{in}$. Each inductor 810, 830 is connected in series to a combination of a transistor 812, 832, respectively, ($Q_1$ and $Q_2$), and a capacitor 814, 834, respectively, having capacitance $C_1$, $C_2$, respectively. Specifically, transistor 812 and capacitor 814 are arranged in parallel, and are connected to inductor 810. Transistor 832 and capacitor 834 are arranged in parallel and are connected to inductor 830. Both transistor

812, 832 and capacitor 814, 834 pairs are grounded. An inductor 840 having an inductance $L_{ZVS}$ is connected in parallel between the inductors 810, 830.

The impedance inverter circuit 804 is configured to convert the load independent circuit 802 from voltage-mode output (constant output voltage) to current-mode output (constant output current). The impedance inverter circuit 804 comprises inductors 850, 852, 860 having inductances $L_{RESa}+L_{3a}$, $L_{RESa}+L_{3b}$ and $L_3$, respectively; capacitor 870 having capacitance $C_3$; and resistor 880 having resistance $R_L$. The inductors 850, 852 are connected in series to the inductor 840. The inductance $L_3$ is equal to inductance $L_{3a}$ and inductance Lab ($L_3=L_{3a}+L_{3b}$). The inductances $L_{RESa}$ and $L_{RESb}$ represent the residual inductance.

In contrast with the AC/DC inverter 310 shown in FIG. 5, the capacitor 870 is connected in parallel with inductor 840. The inductor 860 and resistor 880 are connected in series, and together they are connected in parallel with the capacitor 870. The output current in the inductor 860 is given by equation 15:

$$I_{L_3} = I_{R_L} = 3.132 \times \frac{V_{in}}{\omega L_3} \tag{15}$$

As previously stated, the value of inductance $L_3$ is given by equation 16.

$$L_3=L_{3a}+L_{3b} \tag{16}$$

The current in the inductor 860 is constant regardless of the reflected load. While the impedance inverter circuit 804 is configured to convert the output of the load independent circuit 802 from voltage-mode output (constant output voltage) to current-mode output (constant output current), the value of the output current is dependent on the input voltage and the inductance of the transmitter coil 312. The output current cannot be changed without either changing the input voltage or the inductance of the transmitter coil 312.

Figure 9:
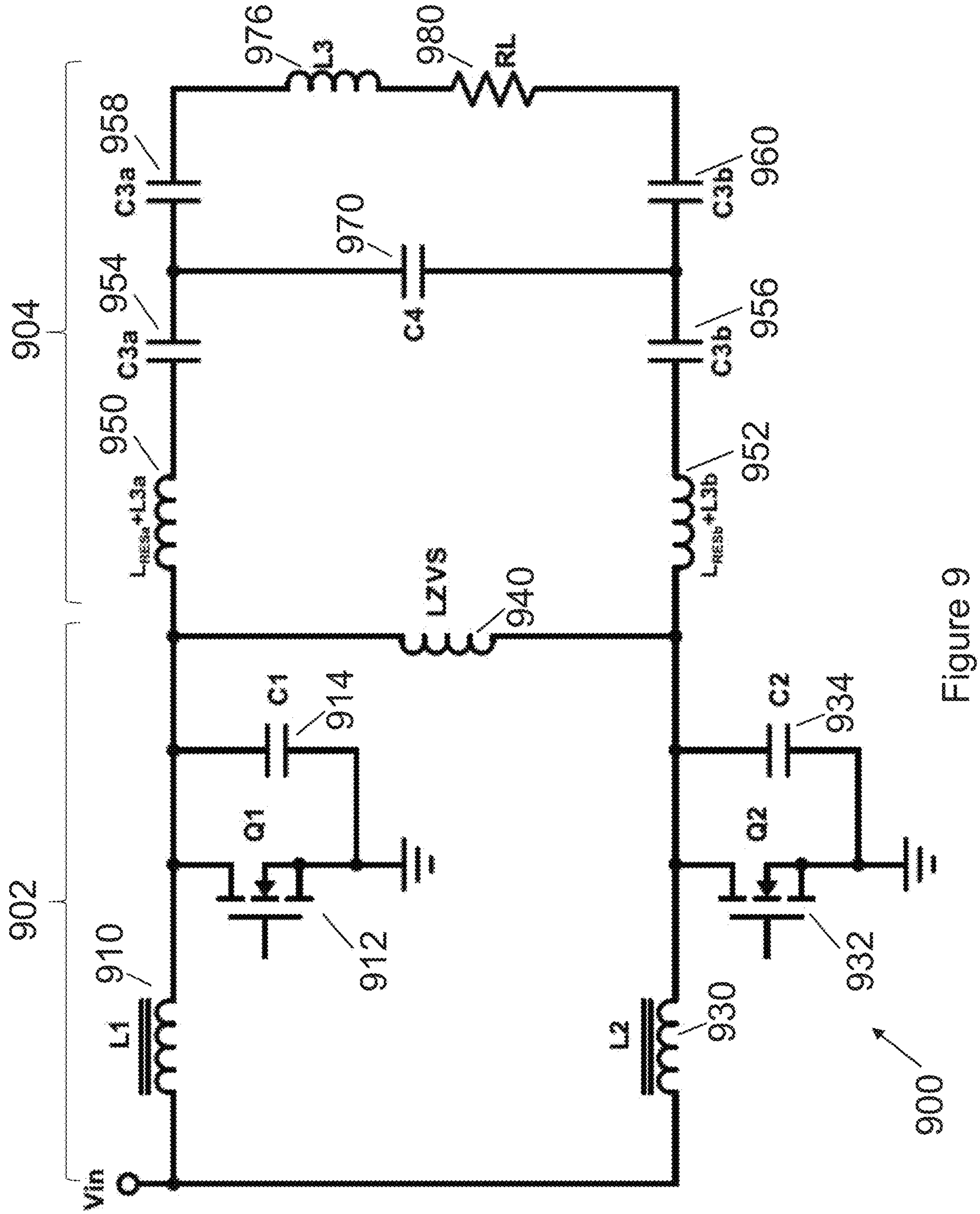
FIG. 9 is a schematic layout of another embodiment of the DC/AC inverter of FIG. 5.

While particular DC/AC inverters 310 and 800 have been described, one of skill in the art will appreciate that other configurations are possible. Turning now to FIG. 9, a schematic layout of another embodiment of the DC/AC inverter generally identified by reference numeral 900 is shown. In this embodiment, the DC/AC inverter 900 comprises a load independent circuit 902 and an impedance inverter circuit 904. The DC/AC inverter 900 is current-mode output (constant output current).

The load independent circuit 902 is configured to convert an input DC signal into an output AC signal. The load independent circuit 902 is voltage-mode output (constant output voltage). The load independent circuit 902 comprises inductors 910, 930 having inductances $L_1$ and $L_2$ that receive an input voltage having a voltage $V_{in}$. Each inductor 910, 930 is connected in series to a combination of a transistor 912, 932, respectively, ($Q_1$ and $Q_2$) and a capacitor 914, 934, respectively. The capacitors 914, 934 have capacitances $C_1$ and $C_2$, respectively. Specifically, transistor 912 and capacitor 914 are arranged in parallel, and are connected to inductor 910. Transistor 932 and capacitor 934 are arranged in parallel and are connected to inductor 930. Both transistor 912, 932 and capacitor 914, 934 pairs are grounded. Inductor 940 having an inductance $L_{ZVS}$ is connected in parallel between the inductors 910, 912.

The impedance inverter circuit 904 is configured to convert the load independent circuit 902 from voltage-mode output (constant output voltage) to current-mode output (constant output current). The impedance inverter circuit 904 has a T-network circuit configuration. The impedance inverter circuit 904 comprises inductors 950, 952, 976 having inductances $L_{RESa}+L_{3a}$, $L_{RESa}+L_{3b}$ and $L_3$, respectively; capacitors 954, 958 each having capacitance $C_{3a}$; capacitors 956, 960 each having capacitance $C_{3b}$; capacitor 970 having capacitance $C_4$; and resistor 980 having resistance $R_L$. The inductance $L_3$ is equal to inductance Lia and inductance $L_3$b ($L_3=L_{3a}+L_{3b}$). The inductances $L_{RESa}$ and $L_{RESb}$ represent the residual inductance. Each inductor 950, 952 is connected in series to a capacitor 954, 956, respectively. The inductor/capacitor pairs 950, 954 and 952, 956 are connected to either end of inductor 940 of the load independent circuit 902. Capacitor 970 is connected in parallel with inductor 940. Further, capacitor 958, inductor 976, resistor 980 and capacitor 960 are connected in series, and together they are connected in parallel to capacitor 970. The capacitance $C_3$ is dependent on the capacitance $C_4$ and is given by equation 17:

$$C_3 = \left(\omega^2\left(L_3 - \frac{1}{\omega^2 C_4}\right)\right)^{-1} \tag{17}$$

The output current in the inductor 976 is given by equation 18:

$$I_{L_3}=I_{R_L}=3.132\times V_m \omega_{C4} \tag{18}$$

As shown in equation 18, the output current in the inductor 976 is dependent on the capacitance $C_4$ of capacitor 970 and the input voltage $V_{in}$.

As previously stated, the inductance $L_3$ of inductor 376 is given by equation 19.

$$L_3=L_{3a}+L_{3b} \tag{19}$$

However, the capacitance $C_3$ is given by equation 20:

$$C_3 = \frac{C_{3a}C_{3b}}{C_{3a}+C_{3b}} \tag{20}$$

Figure 10:
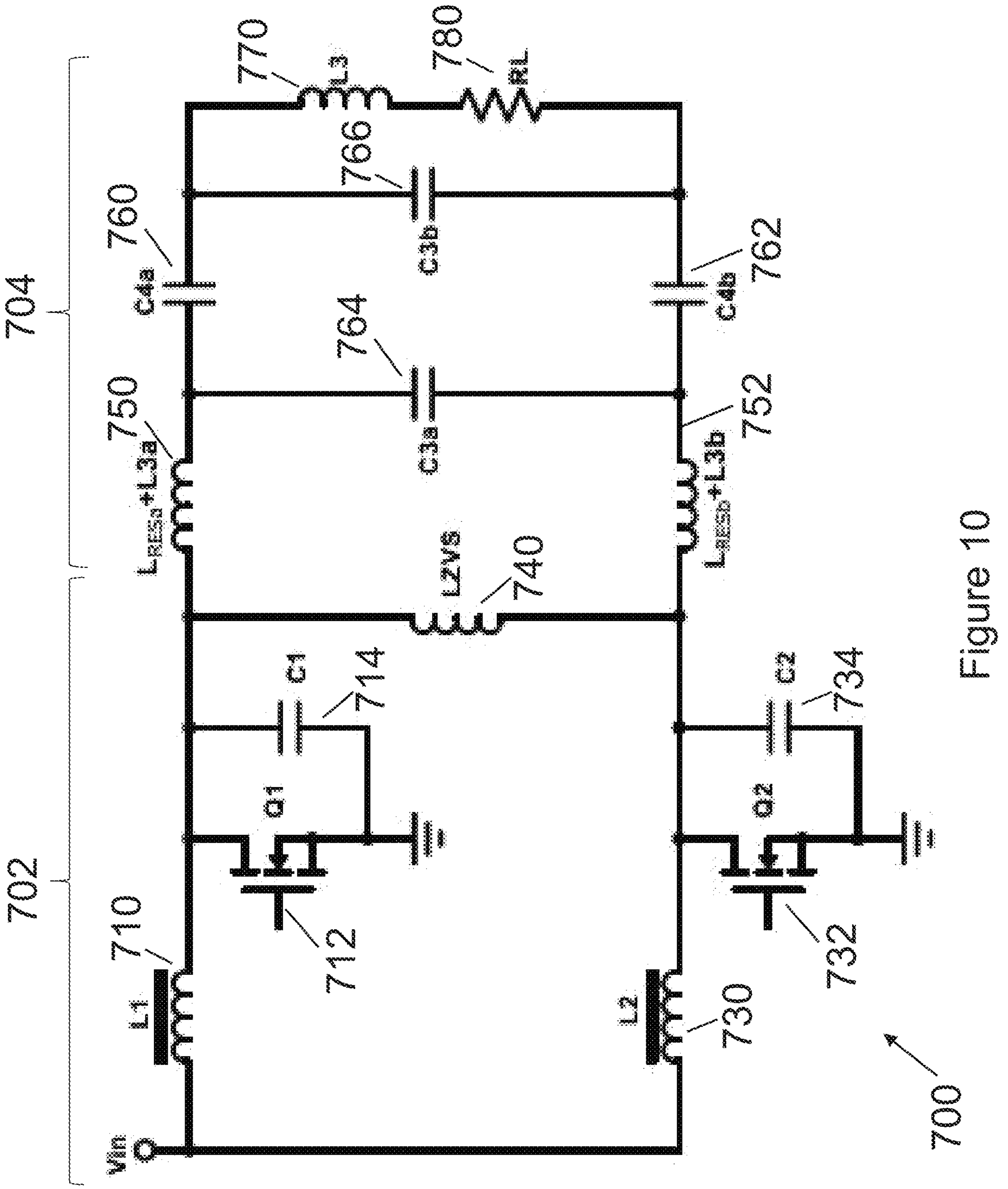
FIG. 10 is a schematic layout of another embodiment of the DC/AC inverter of FIG. 5.

While particular DC/AC inverters 310, 800, and 900 have been described, one of skill in the art will appreciate that other configurations are possible. Turning now to FIG. 10, a schematic layout of another embodiment of the DC/AC inverter generally identified by reference numeral 700 is shown. In this embodiment, the DC/AC inverter 700 comprises a load independent circuit 702 and an impedance inverter circuit 704. The DC/AC inverter 700 is current-mode output (constant output current).

The load independent circuit 702 is configured to convert an input DC signal into an output AC signal. The load independent circuit 702 is voltage-mode output (constant output voltage). The load independent circuit 702 comprises inductors 710, 730 having inductances $L_1$ and $L_2$ that receive an input voltage having a voltage $V_{in}$. Each inductor 710, 730 is connected in series to a combination of a transistor 712, 732, respectively, ($Q_1$ and $Q_2$) and a capacitor 714, 734, respectively. The capacitors 714, 734 have capacitances $C_1$ and $C_2$, respectively. Specifically, transistor 712 and capacitor 714 are arranged in parallel, and are connected to inductor 710. Transistor 732 and capacitor 734 are arranged in parallel and are connected to inductor 730. Both transistor 712, 732 and capacitor 714, 734 pairs are grounded. Inductor 740 having an inductance $L_{ZVS}$ is connected in parallel between the inductors 710, 712.

The impedance inverter circuit 704 is configured to convert the load independent circuit 702 from voltage-mode output (constant output voltage) to current-mode output (constant output current). In contrast with the impedance inverter circuit 904, the impedance inverter circuit 704 has a pi-network circuit configuration. The impedance inverter circuit 704 comprises inductors 750, 752, 770 having inductances $L_{RESa}$+$L_{3a}$, $L_{RESa}$+$L_{3b}$ and $L_3$, respectively; capacitors 760, 762 having capacitances $C_{4a}$, $C_{4b}$, respectively; and resistor 780 having resistance $R_L$. Capacitor 764 having a capacitance $C_{3a}$ is connected in parallel to inductors 750, 752. Capacitor 766 having a capacitance $C_{3b}$ is connected in parallel to capacitors 760, 762. Inductors 770 and resistor 780 are connected in series, and these together are connected in parallel to capacitor 766.

The inductance $L_3$ is equal to inductance $L_{3a}$ and inductance $L_{3b}$ ($L_3$=$L_{3a}$+$L_{3b}$). The inductances $L_{RESa}$ and $L_{RESb}$ represent the residual inductance. The capacitance $C_{3a}$ is equal to capacitance $C_{3b}$ and equal to capacitance $C_3$. The relationship between capacitance $C_3$ and $C_4$ is given by equation 21:

$$C_4 = -\frac{C_3^2 - \frac{C_3}{\omega^2 L_3}}{2C_3 - \frac{1}{\omega^2 L_3}} \tag{21}$$

Capacitance $C_3$ is given by equation 22:

$$C_3=C_{3a}=C_{3b} \tag{22}$$

Capacitance $C_4$ in terms of capacitances $C_{4a}$, $C_{4b}$ is given by equation 23:

$$C_4 = \frac{C_{4a}C_{4b}}{C_{4a}+C_{4b}} \tag{23}$$

Inductance $L_3$ is given by equation 24:

$$L_3=L_{3a}+L_{3b} \tag{24}$$

Residual inductance $L_{RES}$ is given by equation 25:

$$L_{RES} = L_{RESa} + L_{RESb} = \frac{X_{RES}}{\omega} \tag{25}$$

Where $X_{res}$ is the residual reactance, and is w is the operating frequency.

The output current in the inductor 770 or in the resistor 780, which is the current in the transmitter coil 312, is therefore given by equation 26:

$$I_{L_3} = I_{R_L} = 3.132 \times V_{IN}\omega\left(2C_3 + \frac{C_3^2}{C_4}\right) \tag{26}$$

The DC/AC inverter 700 allows the current in the transmitter coil 312 to be set independently of the input DC voltage and the inductance of the transmitter coil 312. The DC/AC inverter 700 is suitable for operation at higher MHz frequencies, e.g. 6:78 MHz and above, as the self-capacitance of the transmitter coil 312 may be absorbed into capacitor 766.

As previously stated, in operation, the DC/AC inverter 310 generates a constant AC voltage or current that does not change with load. However, metal objects in close proximity to the transmitter 302 will detune the transmitter 302 and lead to increased losses. The magnetic field generated by the transmitter coil 312 will induce eddy currents in the metal object leading to losses in the power transfer. The intensity of the induced eddy currents is proportional to the surface area of the metal object, the magnetic field density and the frequency of operation.

As the DC/AC inverter 310 is load independent, the DC/AC inverter 310 maintains ZVS as the load resistance varies. However, the DC/AC inverter 310 may lose ZVS switching if there is a change in the load reactance. The receiver 304 is tuned at the frequency of operation such that the reflected load of load 320 seen by DC/AC inverter 310 is always real if the wireless power transfer coupling or the DC value of the load 320 changes.

However, when a metal object is introduced between the transmitter 302 and receiver 304, or anywhere near the transmitter 302, the reflected load seen by the transmitter 302 will no longer be real and will contain a reactive component due to the eddy currents induced in the metal object. Therefore, the DC/AC inverter 310 no longer achieves ZVS. Furthermore, the voltage waveforms across the transistors 512, 520 ($Q_1$ and $Q_2$) of the DC/AC inverter 310 will be different.

Figure 11:
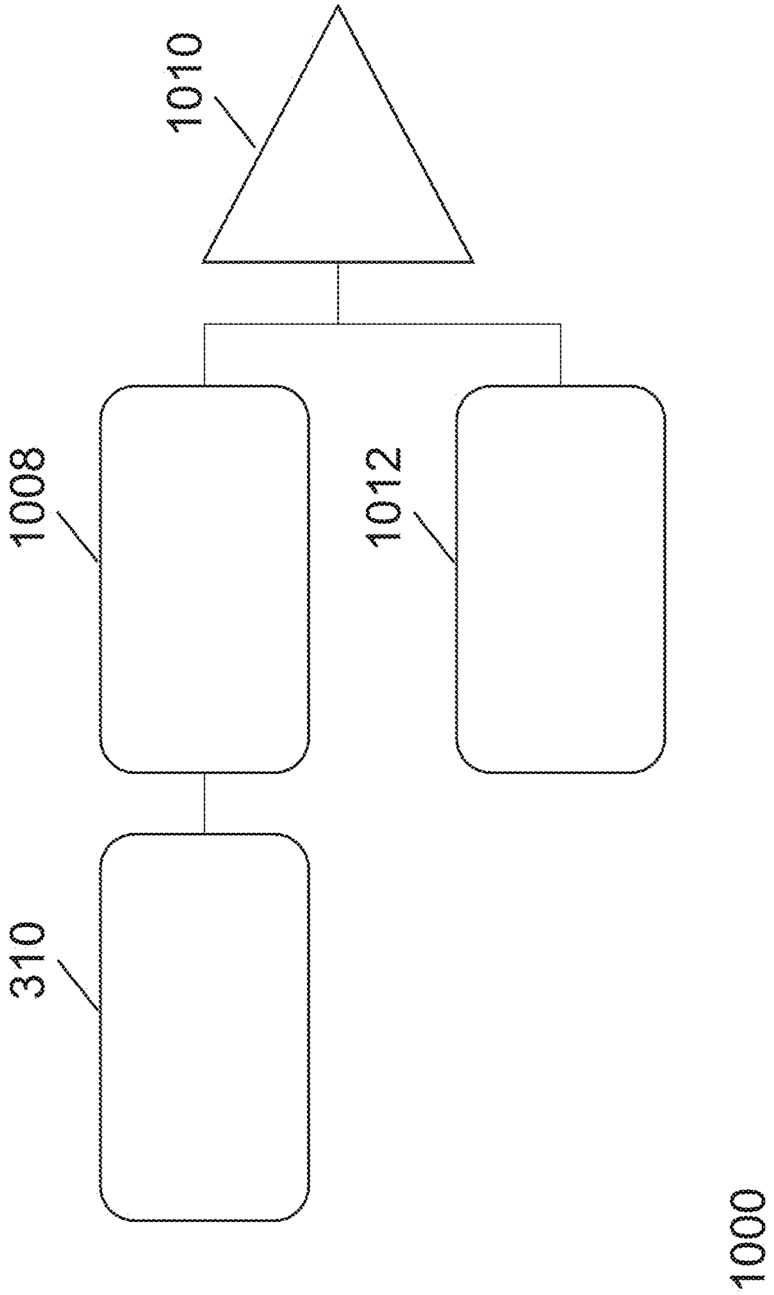
FIG. 11 is a block diagram of another embodiment of the DC/AC inverter of FIG. 5.

Turning now to FIG. 11, another embodiment of a DC/AC inverter generally identified by reference numeral 1000 is shown. The DC/AC inverter 1000 is configured to detect the presence of metal objects.

In this embodiment, the DC/AC inverter 1000 comprises the same components as previously described DC/AC inverter 310. Additionally, the DC/AC inverter 1000 comprises a peak detection circuit 1008, comparator 1010 and threshold setter 1012. The peak detection circuit 1008 is electrically connected to the DC/AC inverter 310. The comparator 1010 is electrically connected to the threshold setter 1012 and the peak detection circuit 1008. The threshold setter 1012 is connected to the comparator 1010.

The peak detection circuit 1008 is configured to measure the peak value of voltage across the transistor 512 ($Q_1$) of the DC/AC inverter 310.

The threshold setter 1012 is configured to set a threshold voltage for comparison with the measured peak value of voltage across the transistor 512 ($Q_1$) of the DC/AC inverter 310.

The comparator 1010 is configured to compare the set threshold voltage with the measured peak value of voltage across the transistor 512 ($Q_1$) of the DC/AC inverter 310. If the measured peak voltage exceeds the threshold voltage, the comparator 1010 is configured to output a detection signal. If the measured peak voltage does not exceed the threshold voltage, the comparator 1010 does not output a detection signal.

Figure 12:
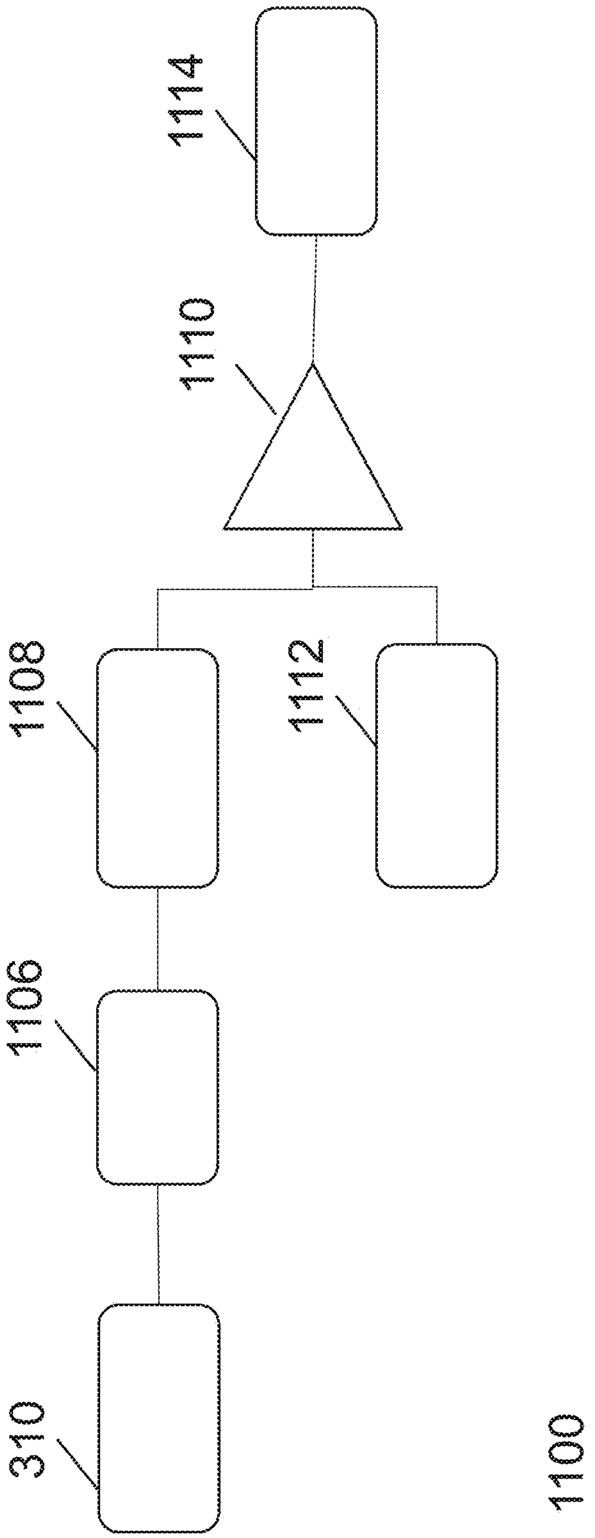
FIG. 12 is a block diagram of another embodiment of the DC/AC inverter of FIG. 5.

While a particular DC/AC inverter 1000 configured to detect the presence of metal objects has been described, one of skill in the art will appreciate that other configurations are possible. Turning now to FIG. 12, another embodiment of the DC/AC inverter generally identified by reference numeral 1100 is shown.

In this embodiment, the DC/AC inverter 1100 comprises the same components as the previously described DC/AC inverter 310. Additionally, the DC/AC inverter 1100 comprises resistive voltage divider 1106, peak detection circuit 1108, comparator 1110, threshold setter 1112, and indicator 1114.

The resistive voltage divider 1106 is connected to the DC/AC inverter 310. The resistive voltage divider 1106 is connected to the peak detection circuit 1108. The peak detection circuit 1108 is connected to the resistive voltage divider 1106. The peak detection circuit 1108 is connected to the compactor 1110. The comparator 1110 is connected to the threshold setter 1112 and the peak detection circuit 1108. The comparator 1110 is connected to the indicator 1114. The threshold setter 1112 is connected to the comparator 1110. The indicator 1114 is connected to the comparator 1110.

The resistive voltage divider 1106 is configured to convert the voltage at the transistor $Q_1$ of the DC/AC inverter 310 to safe levels. Specifically, the resistive voltage divider 1106 is configured to bring down the voltage at the transistor 512 ($Q_1$) of the DC/AC inverter 310 to safe levels. The resistive voltage divider is configured to divide the voltage at the transistor 512 ($Q_1$) of the DC/AC inverter 310.

The peak detection circuit 1108 is configured to measure the peak value of the divided voltage from the resistive voltage divider 1106. The peak detection circuit 1108 outputs the measured peak value to the comparator 1110.

The threshold setter 1112 is configured to set a threshold voltage for comparison with the measured peak value of the divided voltage.

The comparator 1110 is configured to compare the set threshold voltage with the measured peak value of the divided voltage. If the measured peak value of the divided voltage exceeds the threshold voltage, the comparator 1110 is configured to output a detection signal to the indicator 1114. If the measured peak value of the divided voltage does not exceed the threshold voltage, the comparator 1110 does not output a detection signal to the indicator 1114.

The indicator 1114 is configured to receive the detection signal from the comparator 1110. The indicator 1114 is configured to trip or set a fault indicator upon receipt of the detection signal. In this manner, detection of a metal object is clearly indicated.

Figure 13:
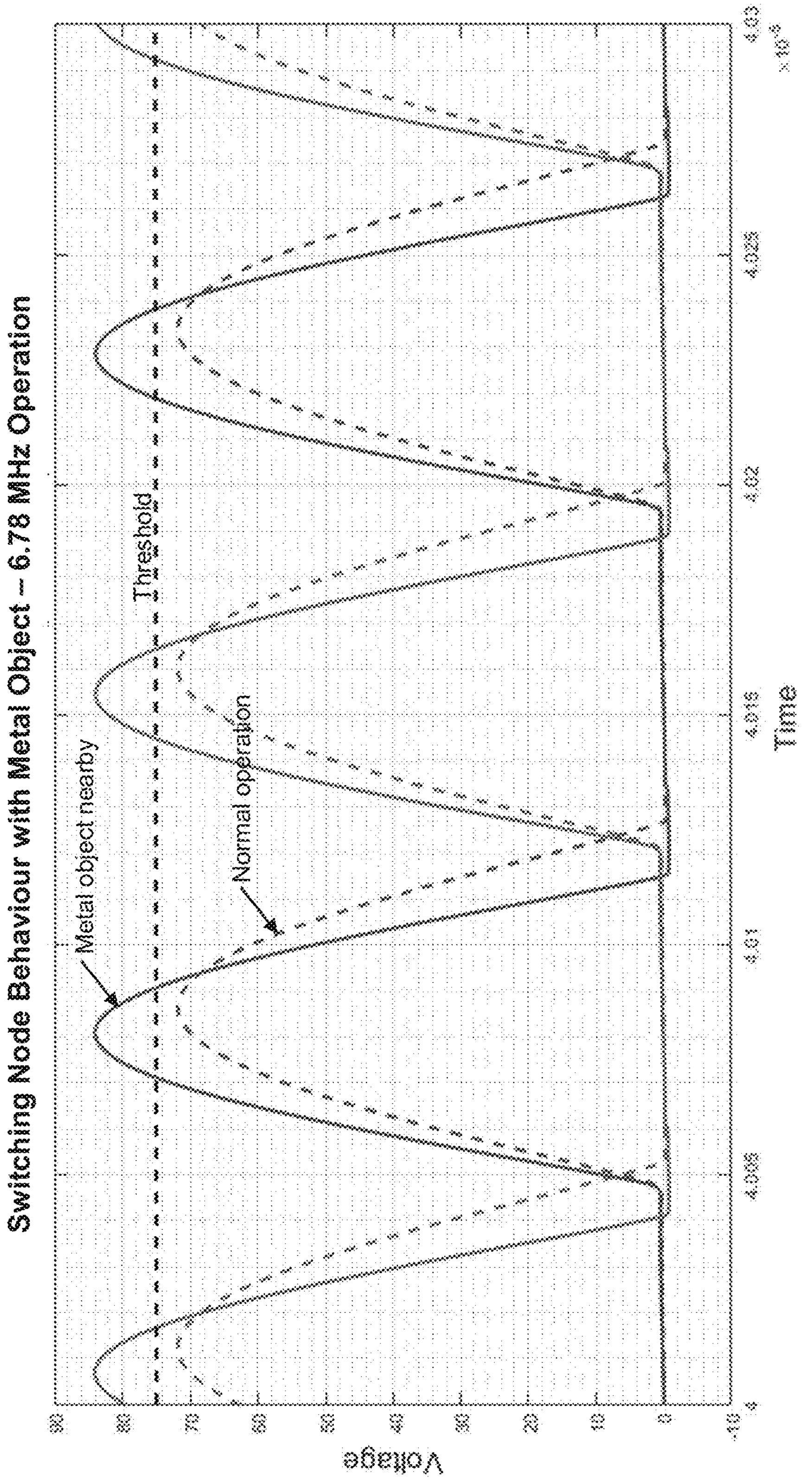
FIG. 13 is a graph of the voltages at a transistor of the DC/AC inverter of FIG. 12 when a metal object is present and not present.

Operation of the AC/DC inverter 1100 will now be discussed. FIG. 13 is a graph of the voltages at the transistor 512 ($Q_1$) of the DC/AC inverter 1100 when a metal object is present and not present during operation of the AC/DC inverter 1100. FIG. 13 further includes the threshold set by the threshold setter 1112. In this embodiment, the DC/AC inverter 1100 has an operating frequency of 6.78 MHz. As shown in FIG. 13, peak voltage increases when a metal object is present. Additionally, when a metal object is present, the voltage reaches zero voltage before the transistor 512 ($Q_1$) is turned on. The voltage reaching zero voltage before the transistor 512 ($Q_1$) is turned on may indicate that the body of the transistor 512 ($Q_1$) is beginning to conduct which will result in increased power loss and reduced efficiency.

Furthermore, the difference between the voltage when a metal object is present and not present is proportional to the intensity of the induced eddy currents. A larger induced eddy current may cause the peak voltage of the transistor 512 ($Q_1$) to increase further. This increased peak voltage may reach the breakdown voltage of the transistor $Q_1$ that may permanently damage the DC/AC inverter 310.

In operation, the resistive voltage divider 1106 receives and converts the voltage at the transistor 512 ($Q_1$) of the DC/AC inverter 310 to safe levels. The peak detection circuit 1108 measures the peak value of the divided voltage from the resistive voltage divider 1106. As shown in FIG. 13, the reactance that is reflected by a metal object is capacitive which results in a voltage waveform across the transistor 512 ($Q_1$) of the DC/AC inverter 310 becoming narrower and higher when compared with the voltage waveform when a metal object is not present. The comparator 1110 receives the measured peak value of the divided voltage from the peak detection circuit 1108 and the set threshold voltage from the threshold setter 1112. As shown in FIG. 13, the measured peak value is clearly higher than the set threshold voltage when a metal object is present. As the measured peak value is clearly higher than the set threshold voltage, the comparator 1110 outputs a detection signal to the indicator 1114. The indicator 1114 trips a fault indicator. This deactivates the DC/AC inverter 1100 and the entire high frequency wireless power transfer system 300 that the DC/AC inverter 1100 is a part of. This prevents not only damage to the DC/AC inverter 1100, but also possible heating of the metal object due to the induced eddy currents.

As previously described, the transmitter 302 operates at a given frequency. In this embodiment, the operating frequency of the transmitter 302 is 13.56 MHz. Furthermore, in this embodiment, the transmitter coil 312 and receiver coil 314 each have dimensions of 23.4 cm×26.2 cm. The coils 312 and 314 each consist of two turns of copper traces having a width of 14 mm on a FR4 printed circuit board (PCB). The coils 312 and 314 have an inductance of approximately 1.50 uH. The reflected load seen by the transmitter coil 312 varies from 0 ohms, at no load 320, to 7 ohms at full load 320. The maximum power required by the load 320 is 30 W. Design examples of the various presented DC/AC inverter embodiments will now be considered given these operating parameters.

An exemplary design embodiment of the DC/AC inverter 310 shown in FIG. 5 will now be discussed. In this embodiment, the transmitter coil 312 and receiver coil 314 have an inductance of 1.5 uH, therefore inductance $L_3$=1.5 uH. The reflected load seen by the transmitter coil 312 varies from 0 ohms, at no load 320, to 7 ohms at full load 320. The maximum power required by the load 320 is 30 W.

Based on the previously described equations various parameters may be determined. As per the maximum reflected load (7 ohms) and the power required (30 W), the current required for the transmitter coil 312 is 2.93 A (i.e. $P_{max}=\frac{1}{2}I_{L3}^2R_L$, therefore $I_{L3}$=2.93 A). The characteristic impedance $Z_0$ is 8.9744 ohms (i.e. $R_{Lmin}/Z_0=0.78$, therefore $Z_0$=8.9744). Furthermore, the values of $L_{ZVS}$ and $C_1$ and $C_2$ are 107 nH for $L_{ZVS}$ and 1.33 nF for $C_1$ and $C_2$. The value of the residual reactance is 27.58 nH (i.e. $0.258*Z_0=2.3154$ ohm). The DC input voltage $V_{in}$ is 6.546 V.

An exemplary design embodiment of the DC/AC inverter 800 shown in FIG. 8 will now be discussed. In this embodiment, the transmitter coil 312 and receiver coil 314 have an inductance of 1.5 uH, therefore inductance $L_3$=1.5 uH. The reflected load seen by the transmitter coil 312 varies from 0 ohms, at no load 320, to 7 ohms at full load 320. The maximum power required by the load 320 is 30 W.

Based on the previously described equations various parameters may be determined. As per the maximum reflected load (7 ohms) and the power required (30 W), the current required for the transmitter coil 312 is 2.93 A (i.e. $P_{max}=\frac{1}{2}I_{L3}^2R_L$, therefore $I_{L3}$=2.93 A). The DC input voltage $V_{in}$ is 119 V (i.e. $I_{L3}=3.132\times V_{in}/w_{L3}$). The characteristic impedance $Z_0$ is 2989 ohms. Furthermore, the values of $L_{ZVS}$ and $C_1$ and $C_2$ are 35.6 uH for $L_{ZVS}$ and 4 pF for $C_1$ and $C_2$.

An exemplary design embodiment of the DC/AC inverter 900 shown in FIG. 9 will now be discussed. In this embodiment, the transmitter coil 312 and receiver coil 314 have an inductance of 1.5 uH, therefore inductance $L_3$=1.5 uH. The reflected load seen by the transmitter coil 312 varies from 0 ohms, at no load 320, to 7 ohms at full load 320. The maximum power required by the load 320 is 30 W. Based on the previously described equations various parameters may be determined. As per the maximum reflected load (7 ohms) and the power required (30 W), the current required for the transmitter coil 312 is 2.93 A (i.e. $P_{max}=\frac{1}{2}I_{L3}^2R_L$, therefore $I_{L3}=2.93$ A). The DC input voltage $V_{in}$ may be set to any voltage. In this embodiment, the DC input voltage $V_{in}$ is 24 V. The capacitance $C_4$ is determined to be 457.5 pF. The capacitance $C_3$ is determined to be 115 pF. The capacitance $C_{3b}$ is identical to capacitance $C_{3a}$. The capacitances $C_{3a}$ and $C_{3b}$ are twice the capacitance $C_3$, as per equation 20, i.e. 230 pF. The characteristic impedance $Z_0$ for a DC input voltage $V_{in}$ of 24 V and a power of 30 W is 120.63 ohms. The values of $L_{ZVS}$ and $C_1$ and $C_2$ are 1.4375 uH for $L_{ZVS}$ and 99 pF for $C_1$ and $C_2$. The residual reactance is 31.12 ohms.

While the high frequency wireless power system 300 has been described as comprising the transmitter 302 configured to transmit power wirelessly via high frequency magnetic inductive coupling and the receiver 304 configured to extract power from the transmitter 302 via high frequency magnetic inductive coupling, one of skill in the art will appreciate that other configurations are possible. In another embodiment, the transmitter 302 is configured to transmit power wirelessly via high frequency electric inductive coupling and the receiver 304 is configured to extract power from the transmitter 302 via high frequency electric inductive coupling. In this embodiment, the transmitter 302 comprises transmitter electrodes rather than the transmitter coil 312, and the receiver 304 comprises receiver electrodes rather than the receiver coil 314.

Although embodiments have been described above with reference to the figures, one of skill in the art will appreciate that variations and modifications may be made without departing from the scope thereof as defined by the appended claims.

What is claimed is:

1. A transmitter comprising:
- a load independent inverter comprising a switched mode zero-voltage switching (ZVS) amplifier; and
- a transmitter coil or electrodes connected to the load independent inverter, the transmitter coil or electrodes configured to transfer power to a receiver via magnetic or electric field coupling,
- wherein the ZVS amplifier comprises,
  - a pair of circuits arranged in parallel, each circuit comprising,
    - at least a transistor and at least a capacitor arranged in parallel; and
    - at least an inductor arranged in series with the transistor and capacitor;
  - only one ZVS inductor connected to the pair of circuits; and
  - at least one capacitor connected to the ZVS inductor and arranged in series with at least an inductor and at least a resistor.

2. The transmitter of claim 1, wherein the transmitter is non-resonant or not self-resonant.

3. The transmitter of claim 1, wherein the transmitter coil is configured to transfer power via magnetic field coupling, or wherein the transmitter electrodes are configured to transfer power via electric field coupling.

4. The transmitter of claim 1, wherein the transmitter further comprises a power source and, wherein the transmitter further comprises a power converter configured to convert a power signal from the power source prior to receipt by the load independent inverter.

5. The transmitter of claim 1, comprising at least two capacitors connected to the ZVS inductor.

6. The transmitter of claim 5, wherein the at least two capacitors are arranged in series with the at least one inductor and resistor.

7. The transmitter of claim 1, wherein at least one of:
- a minimum value of a load resistance normalized to a characteristic impedance of the switched mode ZVS amplifier is between 0.585 and 0.975;
- a q value of the load independent inverter is between 0.739 and 1.231;
- a residual reactance normalized to a characteristic impedance of the load independent inverter is between 0.194 and 0.323;
- a voltage gain value of the load independent inverter is between 2.349 and 3.915; and
- a normalized output power of the load independent inverter is between 4.700 and 7.834.

8. The transmitter of claim 7, wherein the load independent inverter has constant voltage output.

9. The transmitter of claim 8, wherein the load independent inverter has a load range of 5.625 ohms to an infinite or open circuit load.

10. The transmitter of claim 8, further comprising an impedance inverter circuit configured to convert the load independent inverter from constant voltage output to constant current output.

11. The transmitter of claim 10, wherein impedance inverter circuit has a T-network circuit configuration, or a pi-network circuit configuration.

12. The transmitter of claim 1, wherein the load independent inverter has a constant current output.

13. The transmitter of claim 12, wherein the load independent inverter has a load range of zero ohms or a short circuit load to 9.375 ohms.

14. The transmitter of claim 1, wherein the load independent inverter is configured to detect a metal object.

15. The transmitter of claim 14, further comprising:
- a peak detection circuit configured to measure a peak value of voltage across a transistor of the load independent inverter; and
- a comparator configured to compare the peak value of voltage with a threshold voltage and output a detection signal if the peak value of voltage exceeds the threshold voltage.

16. The transmitter of claim 15, further comprising:
- a voltage divider configured to convert the peak value of voltage prior to measurement by the peak detection circuit.

17. The transmitter of claim 1, wherein the switched mode ZVS amplifier is a radio frequency (RF) amplifier.

18. The transmitter of claim 1, wherein the load independent inverter is a class E inverter, or a direct current (DC) to alternating current (AC) inverter.

19. A wireless power transfer system comprising:
- a transmitter comprising:
  - a load independent inverter comprising a switched mode zero-voltage switching (ZVS) amplifier; and
  - a transmitter coil or electrodes connected to the load independent inverter, the transmitter coil or electrodes configured to transfer power to a receiver via magnetic or electric field coupling, wherein the ZVS amplifier comprises,
  - a pair of circuits arranged in parallel, each circuit comprising,
    - at least a transistor and at least a capacitor arranged in parallel; and
    - at least an inductor arranged in series with the transistor and capacitor;
  - only one ZVS inductor connected to the pair of circuits; and at least one capacitor connected to the ZVS inductor and arranged in series with at least an inductor and at least a resistor; and the receiver comprising:

a receiver coil or electrodes configured to extract power from the receiver via magnetic or electric field coupling.

* * * * *